United States Patent [19]

Fukumoto

[11] Patent Number: 5,619,470
[45] Date of Patent: Apr. 8, 1997

[54] NON-VOLATILE DYNAMIC RANDOM ACCESS MEMORY

[75] Inventor: Katsumi Fukumoto, Nara, Japan

[73] Assignee: Sharp Kabushiki Kaisha, Osaka, Japan

[21] Appl. No.: 459,098

[22] Filed: Jun. 2, 1995

[30] Foreign Application Priority Data

Aug. 17, 1994 [JP] Japan ................................. 6-193341

[51] Int. Cl.$^6$ ............................................. G11C 7/00
[52] U.S. Cl. ........................... 365/228; 365/145; 365/194; 365/230.01; 365/236
[58] Field of Search ................................. 365/228, 145, 365/194, 230.01, 236

[56] References Cited

U.S. PATENT DOCUMENTS

| 4,809,225 | 2/1989 | Dimmler et al. | 365/145 |
| 5,381,379 | 1/1995 | Fukumoto | 365/238.5 |

FOREIGN PATENT DOCUMENTS

| 4-42498 | 2/1992 | Japan . |
| 4-87099 | 3/1992 | Japan . |

OTHER PUBLICATIONS

Fukumoto et al., "A 256K–bit non–volatile PSRAM with page recall and chip store" *1991 Sym. VLSI Circuit Dig. Tech. Papers* (1991) pp. 91–92.

Fukumoto et al., "Development of 256Kbit non–volatile DRAM(NV–DRAM) operating as a pseudo–SRAM" *Sharp Technical Journal* (1991) No. 49, pp. 45–49.

Evans et al., "An experimental 512–bit nonvolatile memory with ferroelectric storage cell" *IEEE Journal of Solid–State Circuits* (1988) 23(5):233–237.

Moazzami et al., "A ferrolectric DRAM cell for high–density NVRAM's" *IEEE Electron Device Letters* (1990) 11(10):238–240.

Primary Examiner—David C. Nelms
Assistant Examiner—F. Niranjan
Attorney, Agent, or Firm—Morrison & Foerster LLP

[57] ABSTRACT

A memory device including a memory for storing data having volatile and non-volatile capability; an access circuit for reading/writing the data stored in a volatile state at an address in said memory in accordance with an access command indicating the address; a transfer circuit for transferring the data stored in said memory from the volatile state into a non-volatile state; and a recall circuit for recalling the data stored in said memory in the non-volatile state into the volatile state, wherein said recall circuit selectively performs a recall operation for a section of said memory which includes the address before said access circuit performs a read/write operation for the data when the data at the address is stored in the non-volatile state.

26 Claims, 19 Drawing Sheets

Store-mode
In the case where the data is "0"

Store-mode
In the case where the data is "1"

Recall-mode

PRIOR ART

NON-VOLATILE DYNAMIC RANDOM ACCESS MEMORY

BACKGROUND OF THE INVENTION

1. Field of the Invention

The present invention relates to a semiconductor memory device including a memory having volatile and nonvolatile capabilities.

2. Description of the Related Art

Conventional Non-Volatile Dynamic Random Access Memory devices (hereinafter referred to as "NVDRAM") may be categorized into two types. One type is a NVDRAM in which a Dynamic Random Access Memory (hereinafter referred to as "DRAM") and an Electrically Erasable Programmable Read-Only Memory (hereinafter referred to as "EEPROM") are used in combination. The DRAM is a volatile semiconductor memory device and the EEPROM is a non-volatile semiconductor memory device. The other type is a NVDRAM in which a memory cell includes a ferroelectric material and functions both as a volatile memory and as a non-volatile memory.

A detailed description of the combination type NVDRAM can be found in "A 256 K-bit Non-Volatile PSRAM with Page Recall and Chip Store", 1991 Sym. VLSI Circuit Dig. Tech. papers, May, pp. 91–92, and in "Development of 256 K bit Non-Volatile DRAM (NV-DRAM) Operating as a Pseudo-SRAM", Sharp Technical Journal. No.49, pp.45–49, June, 1991. This type of NVDRAM has a DRAM and an EEPROM within the same memory cell structure (hereinafter, this type of memory cell will be referred to as a combination memory cell). The equivalent circuit of the combination memory cell is shown in FIG. 18.

In a normal DRAM-mode (or a pseudo-SRAM mode), the combination memory cell performs as a conventional DRAM cell which has a select transistor (SG) with storage capacitor (C1). In a store mode, immediately before the NVDRAM is turned off or at any time desired, all DRAM data is transferred to the EEPROM in all memory cells. In recall mode, the data stored in the non-volatile state is transferred from the EEPROM to the DRAM, where it can be accessed.

As a result, a high-speed access to the data stored in the volatile state in the DRAM can be realized during in the normal DRAM mode, while the data stored in the non-volatile state in the EEPROM is retained safely without supplying power to the NVDRAM following the store operation. The advantages of the combination type NVDRAM are that the data can be stored separately in the DRAM and in the EEPROM and there is no limitation as to the number of times the recall operation can be repeated.

On the other hand, a ferroelectric type NVDRAM is described in the following articles: (1) "An Experimental 512 K-bit Non-Volatile Memory with Ferroelectric Storage Cell" IEEE Journal of Solid State Circuits, vol. 23, pp. 1171–1175, October, 1988; (2) "A Ferroelectric DRAM cell for High-Density NVRAM's", IEEE Electron Device Lett., vol. 11, pp. 454–456, October, 1990; and (3) Japanese Laid-Open Patent Application No. 4-42498, "A Semiconductor Memory Device, and a Method for Read/Write the Semiconductor Memory Device".

Article (1) describes a ferroelectric type NVDRAM as including memory cells each having two transistors and two capacitors (hereinafter this type of NVDRAM will be referred to as a two-transistor/cell NVDRAM). In the two-transistor/cell NVDRAM, a read/write operation is performed in a recall/store mode which involves polarization reversal of the ferroelectric material included in the memory cells. However, the 2-transistor/cell NVDRAM cannot satisfy the required number of available polarization reversals ($10^{15}$ to $10^{16}$ times) of the ferroelectric material in order to realize a practical memory device to be used based on 10 years with a cycle time of 100 nsec, because the possible number of the available polarization reversals of the ferroelectric material is limited to $10^{12}$ to $10^{13}$ times at maximum under the present situation.

Article (2) describes a ferroelectric DRAM cell in which polarization reversal only occurs during the non-volatile store/recall operation but not during the normal read/write operation. It is reported that ferroelectric fatigue does not pose a serious endurance problem for this DRAM cell.

Article (3) describes a semiconductor memory device having word lines selected by a row addresses and plate lines and sense amplifiers selected by column addresses to realize low power consumption and high-speed access operation.

The above mentioned ferroelectric type NVDRAMs use memory cells each incorporating a capacitor element which has a thin film made of a ferroelectric material with a crystal structure of a perovskite type, e.g. Y1 (a newly developed ferroelectric ceramic which is less fatigued by a rewrite operation; the composition thereof is yet to be published), PZT ($PbZrTiO_3$, or lead zirconate titanate), PLZT ($PbLaZr-TiO_3$), $PbTiO_3$, etc. Many kinds of ferroelectric material have been developed in order to realize an ideal ferroelectric thin film which has a large remanent polarization and a large dielectric constant and which is not fatigued.

When an AC voltage is applied to the capacitor element having the ferroelectric material, the polarization of the ferroelectric material shows a hysteresis characteristic as shown in FIG. 19. As seen from FIG. 19, the polarization state of the ferroelectric material, which is at point A when it is not polarized, shifts to point B when a positive electric field is applied to the ferroelectric material. The polarization state of the ferroelectric material returns only to point C (instead of A) when the electric field is removed, thus resulting in a positive remanent polarization. This remanent polarization vanishes when a negative electric field is applied. By further increasing the intensity of the negative electric field, the polarization of the ferroelectric material is reversed so that the polarization state shifts to point D. The polarization state of the ferroelectric material returns only to point E when the electric field is again removed, thus resulting in a negative remanent polarization.

Thus, by allowing the polarization of the ferroelectric material to be reversed so as to achieve positive or negative remanent polarization, given data can be stored in a non-volatile manner. Moreover, by simply applying or removing a positive or negative electric field, it can be ensured that the polarization state of the ferroelectric material of the above-mentioned capacitor element shifts only between points B and C or between points D and E, instead of having polarization reversals. Thus, given data can be stored in a volatile manner, as in the case of a usual DRAM. However, in order to retain the data thus stored in a volatile manner, refresh operations are required as in the case of a DRAM.

A ferroelectric type NVDRAM has the advantage that, since the memory cells thereof can be constituted by a smaller number of elements than in the case of a combination type NVDRAM, the cell areas can be reduced, thereby providing for further integration of the device.

Hereinafter, the structure and operation of an exemplary ferroelectric type NVDRAM, where two-transistor/cell memory cells are used, will be described. The two transistor/ cell memory cell is known to be immune to possible variations in the fabrication process.

As shown in FIG. 20, this ferroelectric type NVDRAM includes a plurality of word lines WL and corresponding plate lines PT. The word lines WL are connected to a word line decoder 31. The plate lines PT are connected to a plate line decoder 32. The NVDRAM also includes a plurality of pairs of bit lines bit and bit-bar. Each pair of bit lines bit and bit-bar are connected to a sense amplifier 33. In FIG. 20, only one pair of bit lines bit and bit-bar and their corresponding sense amplifier 33 are shown.

A memory cell 34 is provided in each portion where one of the word lines WL and its corresponding plate line PT intersect a pair of bit lines bit and bit-bar. In FIG. 20, only one memory cell 34 is shown. The memory cell 34 includes two capacitor elements $C_1$ and $C_2$ and two selection transistors $Q_1$ and $Q_2$. One of the terminals of the capacitor element $C_1$ is connected to the bit line bit via the transistor $Q_1$. One of the terminals of the capacitor element $C_2$ is connected to the bit line bit-bar via the transistor $Q_2$. The other terminals of the capacitor elements $C_1$ and $C_2$ are connected to the plate line PT. Gates of the transistors $Q_1$ and $Q_2$ are connected to the word line WL.

The above-described ferroelectric type NVDRAM operates in the following manner. The word line decoder 31 and the plate line decoder 32 select, respectively, one of the word lines WL and one of the plate lines PT, in accordance with an address signal input to an address buffer 35. Then, the memory cell 34 is accessed in a mode chosen in accordance with a control signal input to a control signal input buffer 36. Specifically, the access operation is conducted in one of the following modes: in a DRAM mode (or a volatile mode) for accessing data stored in a volatile state, the NVDRAM is controlled by a DRAM mode timing control circuit 37; in a recall mode for reading and rewriting data stored in a non-volatile state, the NVDRAM is controlled by a recall mode timing control circuit 38; in a store mode for writing data stored in a non-volatile state, the NVDRAM is controlled by a store mode timing control circuit 39. The inputting and the outputting of the data to be accessed are conducted through a data I/O interface 40.

Hereinafter, a write operation in the store-mode, controlled by the store-mode timing control circuit 39, will be described with reference to FIGS. 21 and 22.

As shown in FIG. 21, when data "0" is to be written, for example, a voltage of 0 V and a voltage of 5 V (e.g. supply voltage Vcc) are applied to, respectively, the bit line bit and the bit line bit-bar, and a voltage pulse which varies from 0 V to 5 V and back to 0 V is applied to the plate line PT while keeping the word line WL in an active state. As a result, the polarization state of the ferroelectric material of the capacitor element $C_1$ shifts from point C or point E to point B, and then to point C as shown in FIG. 19. The polarization state of the ferroelectric material of the capacitor element $C_2$ shifts from point D to point E and back to point D as shown in FIG. 19. Accordingly, after these voltages are stopped being applied, the ferroelectric materials of the capacitor elements $C_1$ and $C_2$ have the remanent polarizations of points C and E, respectively, so that the data "0" is stored in a nonvolatile manner.

When data "1" is to be written, as shown in FIG. 22, a voltage of 5 V (e.g. supply voltage Vcc) and a voltage of 0 V are applied to, respectively, the bit line bit and the bit line bit-bar, in contrast to the voltages of 0 V and 5 V applied in the above-mentioned case of writing the data "0". A voltage pulse which varies from 0 V to 5 V and back to 0 V is applied to the plate line PT while keeping the word line WL in an active state, whereby the ferroelectric materials of the capacitor elements $C_1$ and $C_2$ are made to have the remanent polarizations of points E and C, respectively, so that the data "1" is stored in a non-volatile manner.

Next, a recall operation of data in the recall mode, controlled by the recall mode timing control circuit 38, will be described with reference to FIG. 23. In this operation, the pair of bit lines bit and bit-bar are precharged at a voltage of 0 V and thereafter are placed in an open state. Then, a voltage which varies from 0 V to 5 V is applied to the plate line PT while keeping the word line WL in an active state. As a result, in the case where data "0" is stored, the polarization state of the ferroelectric material of the capacitor element $C_1$ shifts from point C to point B as shown in FIG. 19, while the polarization state of the ferroelectric material of the capacitor element $C_2$ shifts from point E to point B. Thus, the polarization of the ferroelectric material of the capacitor element $C_2$ is reversed, so that the potential of the bit line bit-bar, which is connected to the capacitor element $C_2$, becomes higher than that of the bit line bit by hundreds of mV (millivolts).

Accordingly, by sensing the difference between the potentials of the bit lines bit and bit-bar by the sense amplifier 33, the data stored in a non-volatile manner can be read out. However, the polarization states of the capacitor elements $C_1$ and $C_2$ both shift to point B, so that the data which has been stored in a non-volatile manner is lost, resulting in a destructive read-out of the data.

In the recall-mode, the data which has been recalled can be rewritten in the NVDRAM by storing the data in a non-volatile manner. This can be conducted by, after the pair of bit lines bit and bit-bar are set at 0 V and 5 V by the sense amplifier 33, applying a voltage which varies from 0 V to 5 V and back to 0 V to the plate line PT in the same procedure as that for the store-mode. In addition, by maintaining the plate line PT at 0 V after the above procedure, the potentials set for the pair of bit lines bit and bit-bar can be stored in the memory cell 34 as charges, thus realizing storage in a DRAM mode (to be described later).

The potential difference in the pair of bit lines bit and bit-bar which is generated in the recall-mode is in proportion to the intensity of the remanent polarization and in inverse proportion to the bit line capacitance. Accordingly, a larger potential difference can be obtained as the remanent polarization increases and as the bit line capacity decreases, thereby facilitating the detection by the sense amplifier 33.

An access operation in the DRAM-mode, controlled by the DRAM-mode timing control circuit 37, is achieved by the same procedure as that for a conventional DRAM except that a voltage of 0 V or 5 V (e.g. supply voltage Vcc) is applied to the plate line PT. Thus, the polarization states of the ferroelectric materials of the capacitor element $C_1$ and $C_2$ shift only between point D and point E or between point B and point C, neither of which results in any polarization reversal. Therefore, the read and write of the data stored in a volatile manner can be conducted by utilizing the charges stored in the capacitor element $C_1$ and $C_2$ alone, as in the case of a conventional DRAM. Refresh operations are required to retain the data stored in the volatile matter in the DRAM mode.

Although a ferroelectric type NVDRAM using two transistor/cell memory cells, which is relatively immune to influences of the fluctuation in the thickness of the ferroelectric material thin film, was described above, substantially the same principle applies to an NVDRAM having a memory cell array structure of one transistor/cell type having relatively small cell areas and thus being suitable for higher degrees of integration, such as that disclosed in U.S. Pat. No. 5,381,379. In addition, the same principle may be applied to NVDRAMs in which addresses are multiplexed and a row address strobe signal RAS-bar and a column address strobe signal CAS-bar are used, as in a usual case of a DRAM. Multiplexing the addresses has the advantage of reducing the number of terminal pins for the addresses so as to obtain a higher integration of the device.

FIG. 24 shows a configuration of a conventional non-volatile semiconductor memory device 200 using NVDRAMs 41 as mentioned above. An address is applied to each NVDRAM 41 via an address bus from an external control circuit or a microprocessor unit (MPU). Data is input to and output from the NVDRAM 41 via a data bus. A voltage Vcc is also supplied and control signals such as a non-volatile enable signal NE-bar, a chip enable signal CE-bar, an output enable signal OE-bar, a write enable signal WE-bar, and a refresh signal RFSH-bar are input to respective terminals of the NVDRAM 41.

Operations in the device 200 are as follows. As shown in FIG. 25, a self-recall operation is performed for all of the NVDRAM 41 when the power is turned on and the data stored in each NVDRAM 41 is transferred from a non-volatile state into a volatile state (referred to as a power-on recall). The self-recall operation is performed by setting the non-volatile enable signal NE-bar at the low level and returning to the high level (i.e. giving a low-level pulse.), while the output enable signal OE-bar is alternately set at the low level and the high level (i.e. giving a plurality of low-level pulses repeatedly). And then normal operations of read/write/refresh are performed at high speed in the volatile DRAM mode. At the time just before the power is turned off or at any desired time, the store operation is performed for every NVDRAM 41 by giving a low-level pulse to the non-volatile enable signal NE-bar and then to the write enable signal WE-bar.

The self-recall operation, the self-store operation and the circuit structures for performing the operations suitable for use in connection with the present invention are shown in U.S. application Ser. No. 08/325,957, filed on Oct. 20, 1994 and entitled "A NON-VOLATILE DYNAMIC RANDOM ACCESS MEMORY", the disclosure of which is hereby incorporated by reference.

In a conventional NVDRAM used in a pseudo-SRAM mode, a refresh operation synchronized with an external control signal is referred to as an "auto-refresh operation", and a refresh operation may otherwise be referred to as a "self-refresh operation". Similarly, a recall/store operation synchronized with an external control signal may be referred to as an "auto-recall/store operation", and a recall/store operation may otherwise be referred to as a "self-recall/store operation". However, in the following explanation, the terms "self-store", "self-refresh" and "self-recall" include "auto-store", "auto-refresh" and "auto-recall", respectively.

It is possible to operate the combination type NVDRAM and the ferroelectric type NVDRAM described above in the store-mode for writing data in a non-volatile manner and in the recall-mode for reading the data stored in the non-volatile manner. However, in the case of the combination type NVDRAM, available times to rewrite the EEPROM are limited to about one hundred thousand times, so that the EEPROM will soon reach the end of its lifetime if frequent rewrite operations are conducted.

In the case of a ferroelectric type NVDRAM, the ferroelectric materials included in the capacitor elements $C_1$ and $C_2$ permit only a limited number of polarization reversal so that the recalling/store operations are limited to about $10^8$ to $10^{12}$ times. Therefore, the lifetime of the memory cells 34 can expire in a few days by conducting successive accessing at a cycle of about 10 MHz. Therefore, studies are being conducted on materials which leave a large remanent polarization and permit a large number of polarization reversals.

In view of the above problems, in the case of the combination type NVDRAM, the EEPROM is prevented from undergoing an excessively large number of rewrite operations by ensuring that only the DRAM is accessed during usual operations. Accordingly, the data stored in the DRAM is saved in the EEPROM only immediately before the NVDRAM device is turned off, and that all the data is recalled into the DRAM in a recall-mode when the NVDRAM device is turned on the next time.

In the case of a ferroelectric type NVDRAM, the number of the access operations that result in polarization reversals is minimized by ensuring that access operations in the DRAM-mode, which do not result in any polarization reversal, are conducted during usual read/write operations and that the data in the memory cells 34 is stored in a non-volatile manner only before the NVDRAM device is turned off. In the ferroelectric type NVDRAM device, all the data stored in the non-volatile state is recalled to the data stored in the volatile state in the first read operation when the NVDRAM device is turned on the next time. In addition, since the access operation in the recall/store mode requires varying a voltage level of the plate line PT, access operation in the DRAM mode has advantages of reducing a power consumption and realizing a high speed access operation.

The above-mentioned conventional NVDRAM devices perform the recall operation, the refresh operation, the read/write operation in a volatile mode, and refresh operations in accordance with a given combination of a plurality of external input control signals: a non-volatile enable signal NE-bar, a chip enable signal CE-bar, an output enable signal OE-bar, a write enable signal WE-bar and a refresh signal RFSH-bar. In a case of multiplexing addresses, a combination of a row address strobe signal RAS-bar, a column address strobe signal CAS-bar, an output enable signal OE-bar and a write enable signal WE-bar etc, is used.

For example, in a recall mode, the non-volatile enable signal NE-bar and the output enable signal OE-bar are set at the low level (or activated), and in a store mode, the non-volatile enable signal NE-bar and the write enable signal WE-bar are set at the low level. A read operation in a volatile mode is conducted by setting the chip enable signal CE-bar and the output enable signal OE-bar at the low level, and a write operation in a volatile mode is conducted by setting the chip enable signal CE-bar and the write enable signal WE-bar at the low level.

The refresh operation for the data stored in the volatile state can be automatically conducted by providing a self-refreshing system as in the case of a pseudo SRAM. In the self-refreshing system, the refresh operations are sequentially performed for the memory cells by automatically generating addresses by using an internal address counter based on a clock signal. Specifically, the self-refresh operation is conducted by setting a refresh signal RFSH-bar at the low level, or by setting the column address strobe signal CAS-bar at the low level before the row address strobe signal RAS-bar is set at the low level. This enables the simplification of the structure of the peripheral circuits and control of the refresh operations.

In such conventional NVDRAM devices, the data stored in the non-volatile state in every NVDRAM 41 is self-recalled and transferred into the volatile state when the power is turned on. Therefore, the refresh operations are required for retaining the data stored in the volatile state until the store operation is performed. The data never accessed is also self-recalled when the power is turned on (power-on recall operation) and is retained by refresh operations until the store operation is performed or just before the power is turned off (power-off store operation). This may increase a power consumption.

Furthermore, an increasing number of the NVDRAMs 41 operated in the volatile manner in the non-volatile semiconductor memory device result in an increasing power consumption for recall/store operations for a large number of the memory cells in the NVDRAMs 41. Specifically, the power-on recall operation and the power-off store operation require a large current supply in order to be performed in a short time for ensuring the security of the data.

The above-mentioned problems are common to both the case where the NVDRAM device is implemented as a monolithic memory device and the case where the memory cell is implemented as a memory module for a single chip microcomputer.

In addition, a conventional NVDRAM device requires an additional control signal (non-volatile enable signal NE-bar) as compared with a pseudo-SRAM or a normal SRAM. This results in a lack of compatibility with the control signals of existing IC cards which are standardized by the Personal Computer Memory Card International Association (PCM-CIA) or the Japan Electronic Industry Development Association (JEIDA). Hereinafter, this type of standardized IC card will be referred to as a PC card.

In a case where a cache memory using an SRAM or a DRAM is provided to the conventional NVDRAM device, some of the above-mentioned problems may be resolved. However, this may bring on a new problem as follows:

A significant large capacity of cache memory is required to obtain a sufficient so-called "hitting ratio" which means a probability of performing a read/write operation without a recall operation. Transferring the data form the NVDRAM device to the cache memory having a large capacity requires a long time, for example, on the order of about 51.2 msec for transferring data of 512 K byte to a cache memory of 512 K byte (4 M bit) with 100 nsec cycle. In a case where the cache memory has 2 M byte (16 M bit), it takes about 200 msec.

SUMMARY OF THE INVENTION

The semiconductor memory device of this invention includes: a memory for storing data having volatile and non-volatile capability; an access circuit for reading/writing the data stored in a volatile state at an address in said memory in accordance with an access command indicating the address; a transfer circuit for transferring the data stored in said memory from the volatile state into a non-volatile state; and a recall circuit for recalling the data stored in said memory in the non-volatile state into the volatile state, wherein said recall circuit selectively performs a recall operation for a section of said memory which includes the address before said access circuit performs a read/write operation for the data when the data at the address is stored in the non-volatile state.

In another aspect of the invention, the semiconductor memory device includes: a memory for storing data having volatile and non-volatile capability; an access circuit for reading/writing the data stored in a volatile state at an address in said memory in accordance with an access command indicating the address; a transfer circuit for transferring the data stored in said memory from the volatile state into a non-volatile state; a recall circuit for recalling the data stored in said memory in the non-volatile state into the volatile state; an indicating circuit for indicating if recall operation has been performed, after either supplying power to said semiconductor memory device or a last transfer operation has been performed; and a controlling circuit for controlling said access circuit and said recall circuit based on an indication of said indicating circuit, whereby in a case where said indication is positive, said access circuit performs a read/write operation for the data stored at the address, and in a case where said indication is negative, said recall circuit selectively performs a recall operation for a section of said memory which includes the address before said access circuit performs a read/write operation for the data.

In one embodiment of the invention, said control circuit controls said transfer circuit whereby, in a case where said indication is negative for a first section of said memory including the address and is positive for a second section of said memory other than the first section, said transfer circuit performs a transfer operation for the data stored in at least a part of the second section.

The transfer operation for the second section may be performed during the time said recall operation for the first section is performed.

Alternatively, said transfer operation for the second section is performed before or after said recall operation for the first section is performed.

In one embodiment of the invention, said control circuit controls said transfer circuit, whereby said transfer circuit performs the transfer operation when a total amount of addresses included in the second section is larger than a predetermined value.

In one embodiment of the invention, the semiconductor memory device includes a generator for generating a wait signal, the wait signal being output at least during said recall circuit performs the recall operation.

In one embodiment of the invention, the semiconductor memory device includes a generator for generating a store requiring signal for a section of said memory section, the store requiring signal being output in a case where said indication is positive for any address included in the section.

In one embodiment of the invention, said memory includes a first portion for storing the data in a volatile manner and a second portion for storing the data in a non-volatile manner.

In one embodiment of the invention, said memory includes a memory cell which changes the capability between volatile and non-volatile based on a voltage applied to said memory cell.

In one embodiment of the invention, said memory includes a DRAM portion and an EEPROM portion.

In one embodiment of the invention, said memory cell includes a ferroelectric material.

In one embodiment of the invention, the semiconductor memory device includes a refresh circuit for refreshing the data stored in the volatile state in the second section of said memory, during which said recalling circuit performs the recall operation for the first section.

In one embodiment of the invention, the semiconductor memory device further includes: a refresh counter for counting a number of refresh operations successively performed for an address by said refresh circuit; and a control circuit for controlling said transfer circuit based on the number of the refresh operations, whereby said transfer circuit performs the transfer operation for the address when the number is larger than a predetermined value.

In one embodiment of the invention, wherein said counter counts a number of the refresh operations performed after a last read/write operation is performed.

The method of the this invention is a driving method for a semiconductor memory device including a memory for storing data having volatile and non-volatile capability. The method comprises the steps of: reading/writing the data stored in a volatile state at an address in said memory in accordance with an access command indicating the address; transferring the data stored in said memory from the volatile state into a non-volatile state; and recalling the data stored in said memory in the non-volatile state into the volatile state, wherein said recalling step is selectively performed for a section which includes the accessed address before said reading/writing step is performed when the data at the address is stored in the non-volatile state.

In another aspect of the invention, the method comprising the steps of: reading/writing the data stored in a volatile state at the address in said memory in accordance with an access command indicating the address; transferring the data stored in said memory from the volatile state into a non-volatile state; recalling the data stored in said memory in the non-volatile state into the volatile state; indicating if the recalling step has been performed, after either supplying power to said semiconductor memory device or a last transferring step has been performed; and controlling said reading/writing and recalling steps based on an indication by said indicating step, whereby in a case where said indication is positive for the address, said reading/writing step is performed, and in a case where said indication is negative for the address, said recalling step is selectively performed for a section of said memory which includes the address before said reading/writing step is performed.

In one embodiment of the invention, in a case where said indication is negative for a first section of said memory including the address and positive for a second section of said memory other than the first section, said transferring step is preformed for the data stored in at least a part of the second section.

In one embodiment of the invention, said transferring step is performed when a total amount of addresses included in the second section is larger than a predetermined value.

In one embodiment of the invention, the method further comprises the step of generating a wait signal, the wait signal being output at least during the time said recall circuit performs the recall operation.

In one embodiment of the invention, the method further comprises the step of generating a store requiring signal for a section of said memory, the store requiring signal being output in a case where said indication is positive for any address included in the section.

In one embodiment of the invention, the method further includes the step of refreshing the data stored in the volatile state in the second section of said memory section, during the time said recalling step is performed for the first section.

In one embodiment of the invention, the method further comprises the steps of: counting a number of successive refresh operations performed for an address in said refreshing step; and controlling said transferring step based on the counted number of the successive refresh operations, whereby said transferring step is performed for the address when the counted number is larger than a predetermined value.

In one embodiment of the invention, said counting step is performed after a last read/write operation is performed in said reading/writing step.

Thus, the invention described herein makes possible the advantages of providing a semiconductor memory device and a driving method for the same which (1) reduces power consumption by selectively performing a recall operation for the section of a memory which is accessed so as to minimize a requirement for the refresh operation, and (2) is convenient to use by providing compatibility of control signals with those of existing PC cards.

These and other advantages of the present invention will become apparent to those skilled in the art upon reading and understanding the following detailed description with reference to the accompanying figures.

DESCRIPTION OF THE PREFERRED EMBODIMENTS

The non-volatile semiconductor memory device of the present invention includes a plurality n of NVDRAM devices. Each NVDRAM device may be a combination type NVDRAM, a ferroelectric type NVDRAM, or another type NVDRAM which has volatile and non-volatile capability. In addition, the semiconductor memory device may be realized as a monolithic memory device, a memory module for a single chip microcomputer, or a multi-chip memory module such as an IC card or a PC card.

When a power is turned on, a power-on recall operation is not performed for all the NVDRAM devices, but a self-recall operation is selectively performed for only those NVDRAM devices including a memory cell which is addressed by an access command. Data stored in the accessed NVDRAM devices is transferred from a non-volatile state into a volatile state which requires refresh operations to retain the data. Data stored in NVDRAM devices which has not been accessed remains stored in a non-volatile state which requires no refresh operation. This results in a reduction of the number of activated NVDRAM devices so as to minimize power consumption due to the recall operation and the refresh operation.

Hereinafter, the present invention will be described in detail with reference to the drawings in the exemplary context of a PC card type non-volatile semiconductor memory device using a ferroelectric type NVDRAM. The PC card type memory device is suitable for use in a portable information device which may have a power supply with a small capacitance.

Figure 1:
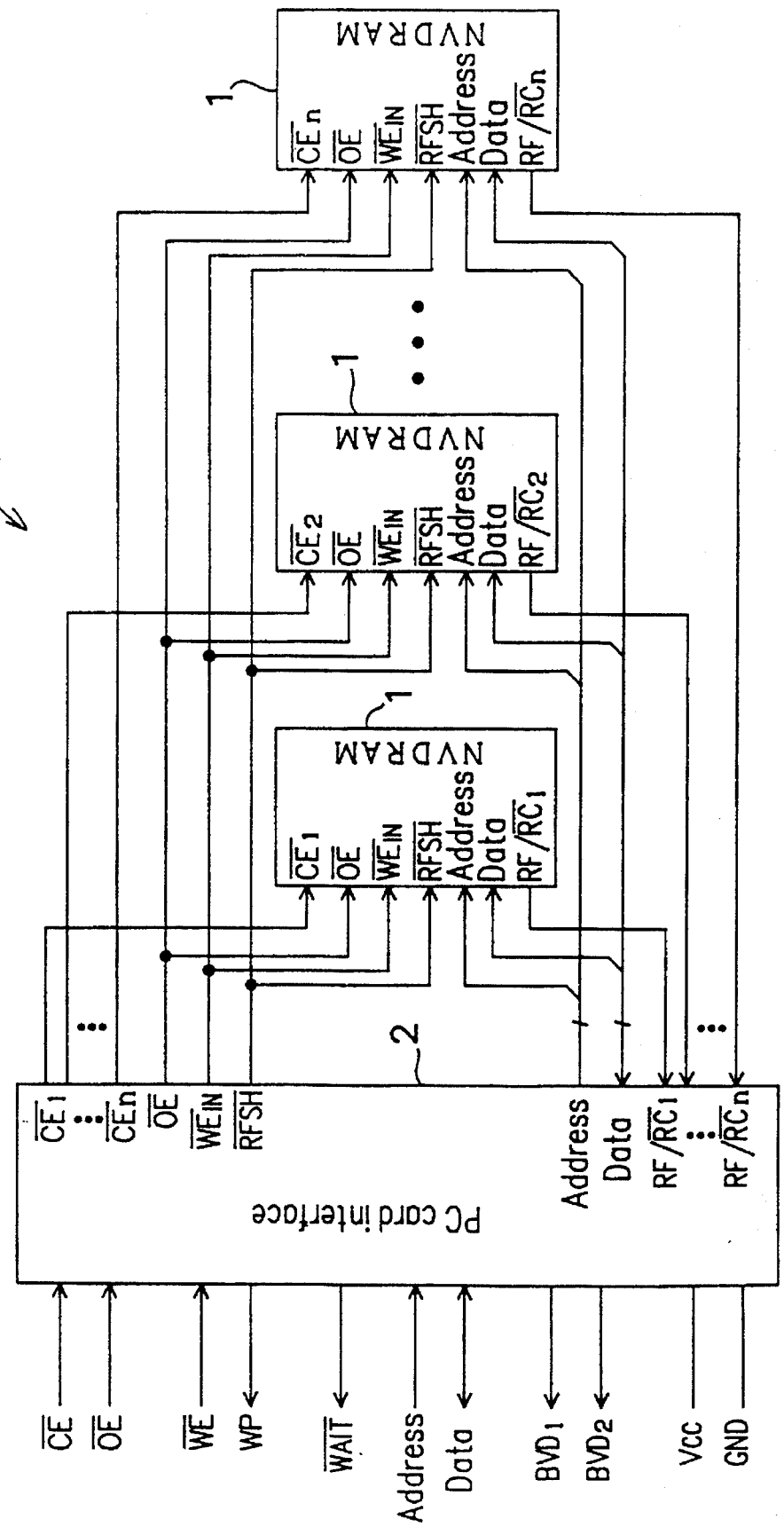
FIG. 1 is a block diagram schematically showing an overall configuration of a non-volatile dynamic random access memory of the present invention.

As shown in FIG. 1, the semiconductor memory device 100 includes a plurality n of NVDRAMs 1 and a PC card interface 2. In this example, each NVDRAM 1 is an integrated circuit (IC) chip including a ferroelectric type NVDRAM having 2-transistor/cell type memory cells and peripheral circuits. The NVDRAM 1 performs recall/store/refresh operations automatically for every memory cell by generating internal row addresses. Therefore, recall and store operations are performed by the chip (i.e. the NVDRAM 1) as a unit.

Each NVDRAM 1 outputs a storage state indication signal $RF/RC_i$-bar (i=1,2, . . . ,n) indicating whether data stored in the NVDRAM 1 is in a non-volatile state or in a volatile state. The storage state indication signal $RF/RC_i$-bar is called as a refresh requiring signal when it is at a logic high (H) level, and as a recall requiring signal when it is at a logic low (L) level.

The PC card interface 2 is an interface circuit for adjusting signals input to and output from the NVDRAMs 1 to signals input to and output from the connectors of the PCMCIA/JEIDA standard. The PC card interface 2 can be easily implemented, since each NVDRAM 1 does not require a non-volatile enable signal NE-bar which is specifically required in conventional NVDRAM devices. Alternately, each NVDRAM 1 may use a non-volatile enable signal NE-bar if the corresponding terminal is provided to the PC card interface 2. Other signals standardized with the PCMCIA/JEIDA standard are well known to a person having ordinary skill in the art, and will not be described in detail here.

Figure 2:
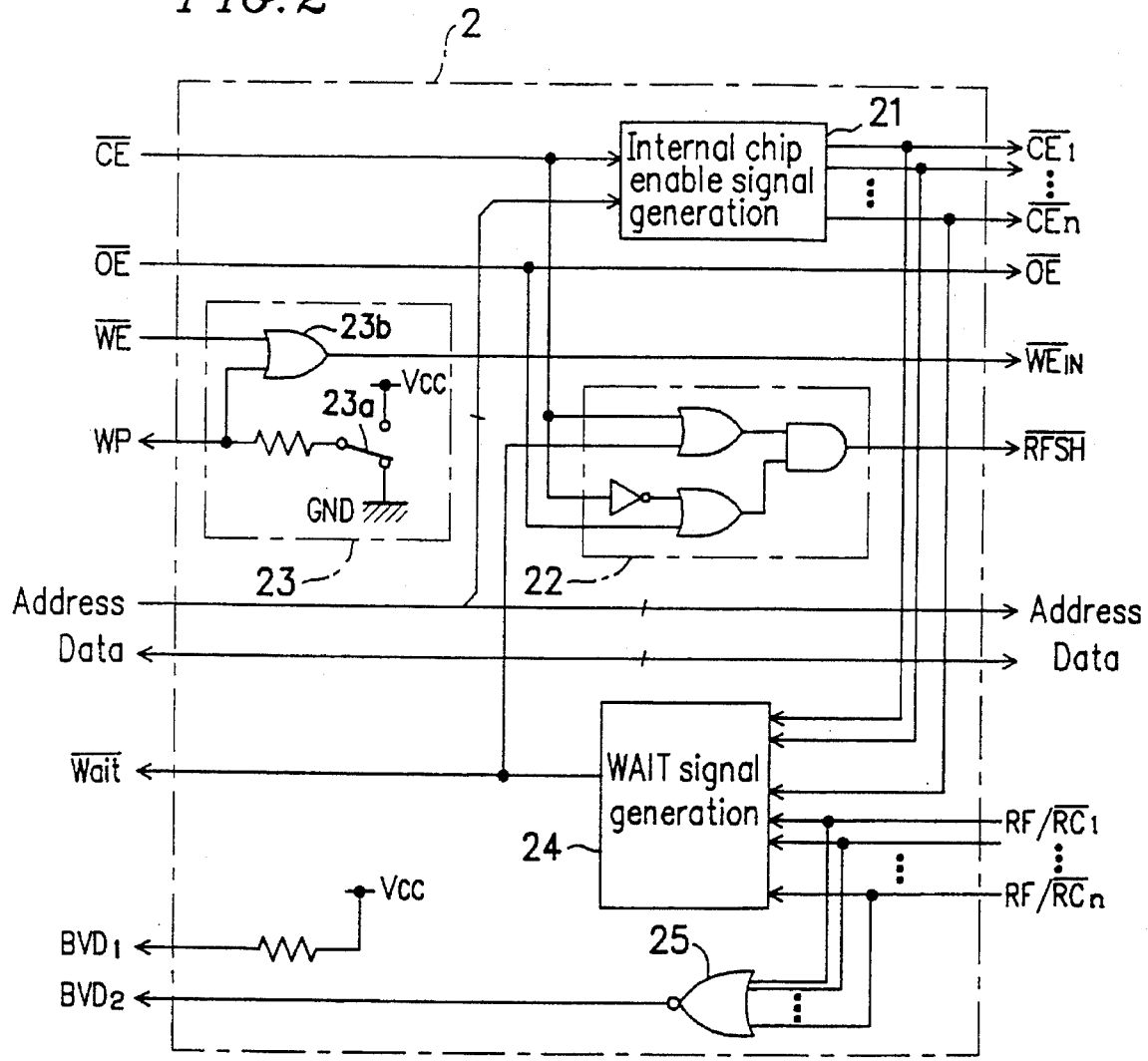
FIG. 2 is a block diagram showing a PC interface circuit.

As shown in FIG. 2, the PC card interface 2 has an internal chip enable signal generation circuit 21, a refresh signal generation circuit 22, an internal write enable signal generation circuit 23, a wait signal generation circuit 24, and a NOR gate 25. A chip enable signal CE-bar is input from an peripheral circuit (such as an external microprocessor unit (MPU) of a portable information device) to the PC card interface 2. The chip enable signal CE-bar is transformed into internal chip enable signals $CE_i$-bar (i=1, 2, . . . ,n) by the internal chip enable signal generation circuit 21, and then provided to the corresponding NVDRAMs 1.

Figure 3:
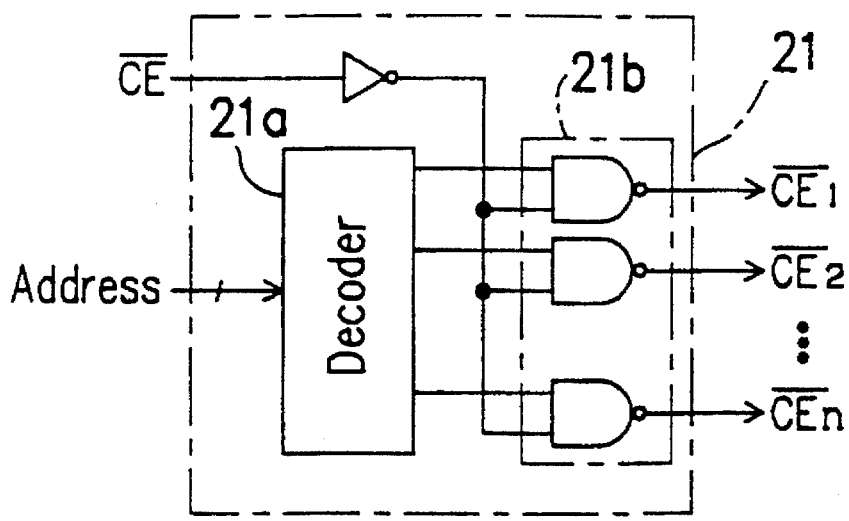
FIG. 3 is a block diagram showing an internal chip enable signal generation circuit.

The internal chip enable signal generation circuit 21 is a circuit for selecting a chip (i.e. one of the NVDRAMs 1) as shown in FIG. 3. The internal chip enable signal generation circuit 21 decodes, for example, the most significant bits of an address signal on an address bus by using a decoder 21a. The decoded address signal is output via a gate circuit 21b only when the chip enable signal CE-bar is at the L-level (i.e., activated). Accordingly, when the chip enable signal CE-bar is set at the L-level, one of the internal chip enable signals $CE_i$-bar which is sent to the NVDRAM 1 including a memory cell at the decoded address is set at the L-level. An access command selects the NVDRAM 1 to be subjected to an access operation by setting the chip enable signal CE-bar at the L-level and providing an address signal on the address bus so as to supply the corresponding internal chip enable signal $CE_i$-bar.

Referring again to FIG. 1, an output enable signal OE-bar is supplied to each NVDRAM 1 and the refresh signal generating circuit 22. A write enable signal WE-bar is transformed into an internal write enable signal $WE_{IN}$-bar by the internal write enable signal generation circuit 23, and then provided to each NVDRAM 1.

The internal write enable signal generation circuit 23 has a switch 23a and an OR gate 23b as shown in FIG. 2. The switch 23a sets a write protect state to the PC card. When the switch 23a is in a write allowable state, i.e., connected to ground GND, the write enable signal WE-bar is output as the internal write enable signal $WE_{IN}$-bar via the OR gate 23b. On the other hand, when the switch 23a is in the write protect state, i.e., connected to a power source Vcc, the write enable signal WE-bar masked by the OR gate 23b so as to set the internal write enable signal $WE_{IN}$-bar at the H-level and a write operation for each NVDRAM 1 is inhibited. The internal write enable signal generation circuit 23 also outputs a write protect signal WP indicating the connection state of the switch 23a. The write protect signal WP set at H-level indicates that the PC card is inhibited from a write operation.

The most significant bits of the address signal are sent to the internal chip enable signal generation circuit 21, the most significant bits representing the address of the NVDRAM 1 which is to be enabled. The remaining bits on the address signal are sent to each NVDRAM 1 to specify a particular address within the selected NVDRAM 1. A data signal on the data bus is sent to the NVDRAM 1.

Figure 4:
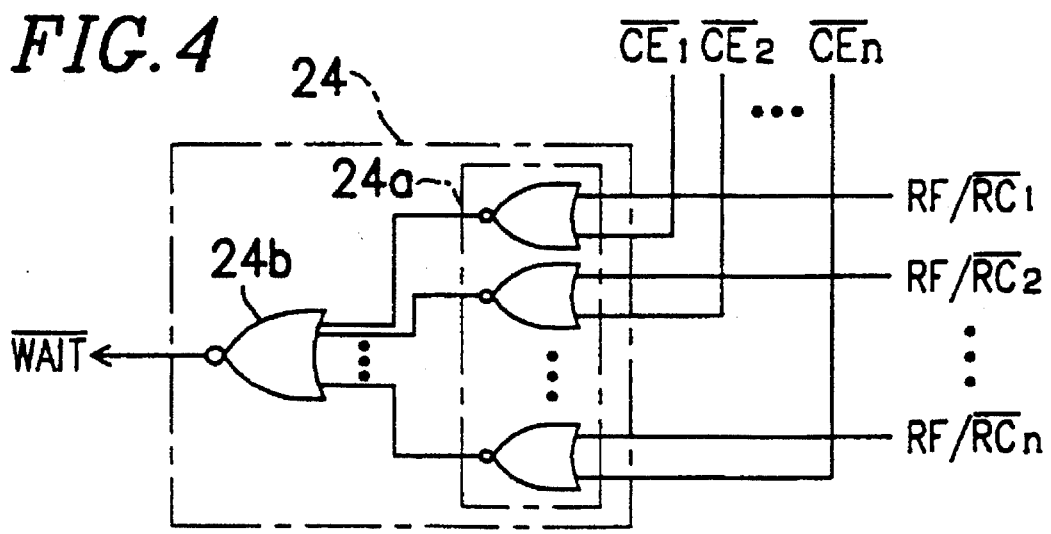
FIG. 4 is a block diagram showing a wait signal generation circuit.

The storage state indication signals RF/RC$_i$-bar (i=1, 2, ... ,n) output from the respective NVDRAMs 1 are input to the wait signal generating circuit 24, and are transformed into a wait signal WAIT-bar. Referring to FIG. 4, the internal chip enable signals CE$_i$-bar (i=1, 2, ... , n) are also input to the wait signal generating circuit 24. As shown in FIG. 4, a gate circuit 24a detects if the internal chip enable signal CE$_i$-bar and the storage state indication signal RF/RC$_i$-bar are both at the L-level for any of the NVDRAMs 1. When such condition is detected, the wait signal WAIT-bar becomes active at the L-level and is output via a NOR gate 24b. Accordingly, the wait signal WAIT-bar is set at the L-level in a case where the data stored in the NVDRAM 1 which is accessed has not been recalled into the volatile state. In this case, a self-recall operation is performed for the accessed NVDRAM 1 (the self-recall operation will be described later).

The storage state indication signals RF/RC$_i$-bar (i=1, 2, ... , n) are also input to the NOR gate 25, as shown in FIG. 2, and are transformed into a second backup voltage detection signal BVD2 replaced by the output of the NOR gate 25. The second backup voltage detection signal BVD2 is set at the L-level when the data has been recalled for at least one of the NVDRAMs 1. A first backup voltage detection signal BVD1 is pulled up to the power source level Vcc by a pullup resistor and consequently its output is always at the H-level. These first and second backup voltage detection signals BVD1 and BVD2 are conventionally used as signals indicating a voltage level condition of the backup power source in the PCMCIA/JEIDA standard. However, the present invention does not use a backup power source (e.g., a battery), so that the first and second backup voltage detection signals BVD1 and BVD2 are used as signals indicating that the data of all the NVDRAMs 1 is stored in the non-volatile state.

The conventional meanings of the first and second backup voltage detection signals BVD1 and BVD2 are as follows:

TABLE 1

| BVD1 | BVD2 | meaning |
| --- | --- | --- |
| H | H | normal voltage level |
| H | L | data valid; battery change required |
| L | H | data unsure; battery change required |
| L | L | data unsure; battery change required |

In this example of the present invention, the second backup voltage detection signal BVD2 at the H-level instead represents as that all of the NVDRAMs 1 in the PC card store the data in the non-volatile manner. The second backup voltage detection signal BVD2 at the L-level represents as that at least one of the NVDRAMs 1 in the PC card stores the data in the volatile manner. This makes it possible to detect a requirement for store operation to be performed before the power supply is turned off. The function of the first and second backup voltage detection signals BVD1 and BVD2 may be exchanged as will be appreciated. Other standardized signals, if any, may be used instead of the first and second backup voltage detection signals BVD1 and BVD2.

Continuing to refer to FIG. 2, the wait signal WAIT-bar is also input to the refresh signal generating circuit 22. The refresh signal generating circuit 22 transforms the chip enable signal CE-bar, the output enable signal OE-bar and the wait signal WAIT-bar into the refresh signal RFSH-bar by using logical gates operating in accordance with the truth table (Table 2.) as follows:

TABLE 2

| CE-bar | OE-bar | WAIT-bar | RFSH-bar |
| --- | --- | --- | --- |
| H | H | — | H |
| H | L | — | L |
| L | — | H | H |
| L | — | L | L |

In Table 2, "-" means "don't care". The refresh signal RFSH-bar is sent to each NVDRAM 1. Each NVDRAM 1 performs a refresh operation for the data stored in the volatile state when the refresh signal RFSH-bar is set at the L-level. An input terminal of the NVDRAM 1 for the refresh signal RFSH-bar may be used at the same time as that for the output enable signal OE-bar, as usual in the conventional pseudo-SRAM.

The output enable signal OE-bar is conventionally used as a signal for allowing the NVDRAM 1 to output the data on the data bus when the NVDRAM 1 is accessed (i.e. the chip enable signal CE-bar is at the L-level). When the chip enable signal CE-bar is at the H-level, the output enable signal OE-bar may be used as a signal for controlling the refresh operation for the NVDRAM 1. As shown in Table 2, the chip enable signal CE-bar at the H-level and the output enable signal OE-bar at the L-level result in the refresh signal RFSH-bar at the L-level. A self-refresh operation is performed by using the refresh signal RFSH-bar at the L-level when the data stored in the NVDRAM 1 is not accessed. In this example, the chip enable signal CE-bar at the L-level and the wait signal WAIT-bar at the L-level also result in the refresh signal RFSH-bar at the L-level. Therefore, when one of the NVDRAMs 1 is accessed and a self-recall operation is performed for the accessed NVDRAM 1, a self-refresh operation is performed for another NVDRAM 1 during the self-recall operation performed for the accessed NVDRAM 1.

Figure 5:
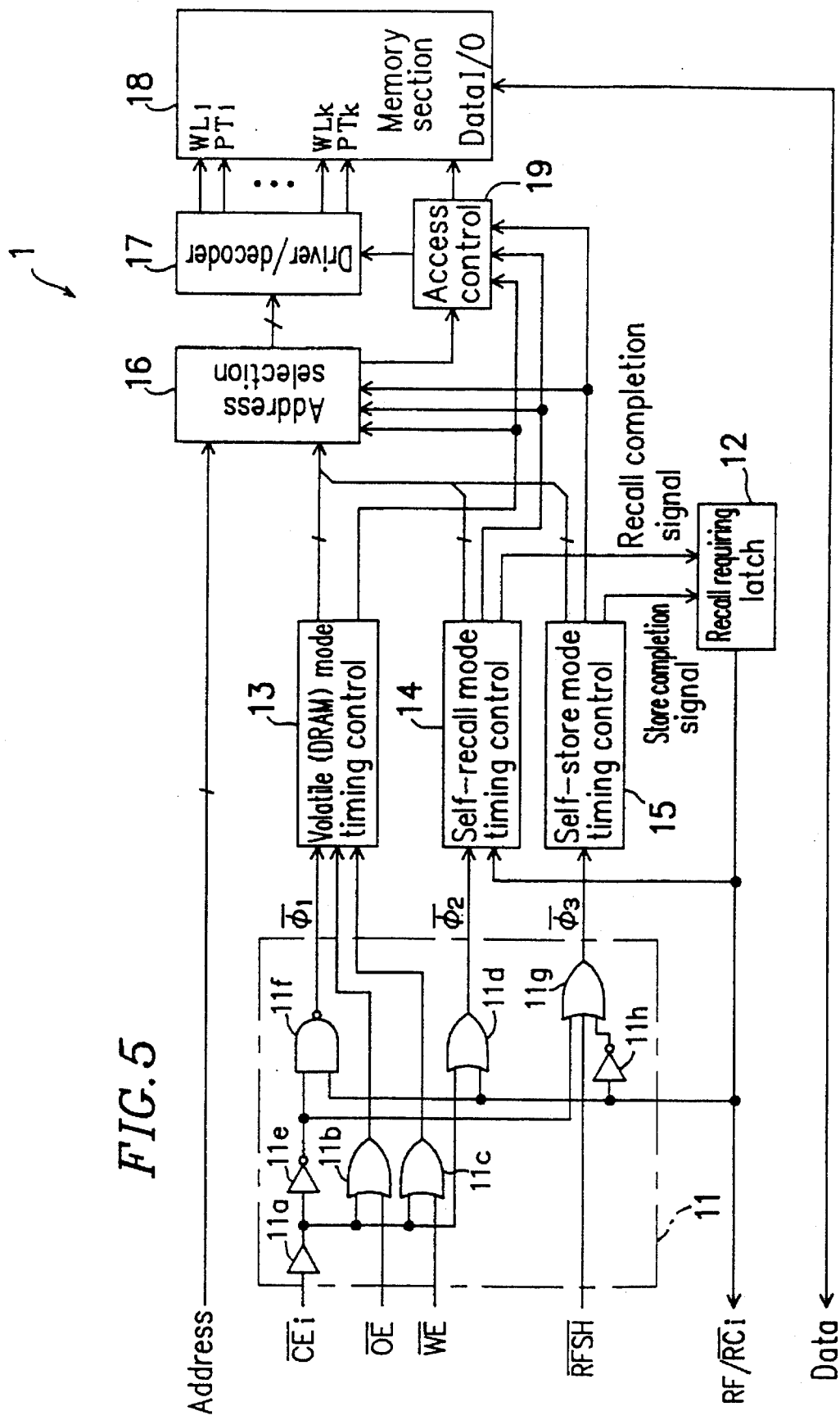
FIG. 5 is a diagram showing a configuration for a memory device in an embodiment of the present invention.

Next, the NVDRAM 1 is described in detail with reference to FIG. 5. The NVDRAM 1 has a control signal input circuit 11, a recall requiring latch circuit 12, a volatile (DRAM) mode timing control circuit 13, a self-recall mode timing control circuit 14, a self-store mode timing control circuit 15, an address selection circuit 16, a driver/decoder circuit 17, a memory section 18, and an access control circuit 19.

An address signal is input via the address selection circuit 16 and is decoded by the driver/decoder circuit 17 so that a memory cell at the decoded address in the memory section 18 is accessed. Control signals for controlling the access operation are supplied via the control signal input circuit 11 to the recall requiring latch circuit 12, the volatile mode timing control circuit 13, the self-recall mode timing control circuit 14, and the self-store mode timing control circuit 15. These timing control circuits 13 to 15 are used in the respective operation modes. The access control circuit 19 controls the driver/decoder circuit 17 and operations of the memory section 18 based on the control signals from the timing control circuits 13 to 15.

The recall requiring latch circuit 12 outputs the storage state indication signals RF/RC$_i$-bar (i=1, 2, ... , n). The storage state indication signal RF/RC$_i$-bar for each NVDRAM 1 is set at the L-level when the power source is turned on, and is output as a recall requiring signal. The storage state indication signal RF/RC$_i$-bar is set at the H-level when a recall completion signal is input from the self-recall mode timing control signal 14, and is output as a refresh requiring signal. The refresh requiring signal at the H-level returns to the recall requiring signal at the L-level when a store completion signal is sent from the self-store mode timing control circuit 15.

The control signal input circuit 11 is a logic circuit for generating a volatile mode signal φ1-bar, a recall mode signal φ2-bar, and a store mode signal φ3-bar base on the internal chip enable signal CE$_i$-bar, the output enable signal OE-bar, the write enable signal WE-bar, the refresh signal RFSH-bar, and the storage state indication signal RF/RC$_i$-bar.

The internal chip enable signal CE$_i$-bar is supplied to OR gates 11b, 11c and 11d via a buffer circuit 11a, and to a NAND gate 11f and an OR gate 11g after being inverted by an inverter 11e. The output enable signal OE-bar and the write enable signal WE-bar are sent to the OR gates 11b and 11c, respectively. The refresh signal RFSH-bar is sent to the OR gate 11g. The storage state indication signal RF/RC$_i$-bar is sent to the NAND gate 11f and the OR gate 11d, and to the OR gate 11g after being inverted by an inverter 11h. An output signal of the NAND gate 11f is sent to the volatile mode timing control circuit 13 as the volatile mode signal φ1-bar. An output signal of the OR gate 11d is sent to the self-recall mode timing control circuit 14 as the recall mode signal φ2-bar. An output signal of the OR gate 11g is sent to the self-store mode timing control circuit 15 as the store mode signal φ3-bar. Output signals of the OR gate 11b and 11c are sent to the volatile mode timing control circuit 13 as the output enable signal OE-bar and the write enable signal WE-bar, respectively, when the internal chip enable signal CE$_i$-bar is at the L-level (i.e., an access operation is performed for the corresponding NVDRAM 1).

Accordingly, the control signal input circuit 11 outputs the volatile mode signal φ1-bar at the L-level (active low) when the internal chip enable signal CE$_i$-bar is at L-level and the storage state indication signal RF/RC$_i$-bar is at the H-level, as shown in Table 3 below.

TABLE 3

| CE$_i$-bar | RF/RC$_i$-bar | φ1-bar |
|---|---|---|
| L | H | L |
| otherwise | | H |

The volatile mode timing control circuit 13 performs an access operation when an access command is input for an address included in the NVDRAM 1 and data at the address has been recalled into the volatile state. The volatile mode timing control circuit 13 controls an access for read/write operation based on the write enable signal WE-bar and controls a data outputting in the read operation based on the output enable signal OE-bar.

The control signal input circuit 11 also outputs the recall mode signal φ2-bar at the L-level (active low) when both of the internal chip enable signal CE$_i$-bar and the storage state indication signal RF/RC$_i$-bar are at the L-level, as shown in Table 4 below.

TABLE 4

| CE$_i$-bar | RF/RC$_i$-bar | φ2-bar |
|---|---|---|
| L | L | L |
| otherwise | | H |

The self-recall mode timing control circuit 14 performs a recall operation when an access command is input for an address included in the NVDRAM 1 and data at the address has not been recalled but is in the non-volatile state. When the recall operation is completed, the storage state indication signal RF/RC$_i$-bar output from the recall requiring latch circuit 12 is turned to H-level, resulting in the recall mode signal φ2-bar at the H-level and the volatile mode signal φ1-bar at L-level. Then an access operation is performed for the recalled data by the volatile mode timing control circuit 13.

The control signal input circuit 11 outputs the store mode signal φ3-bar at the L-level (active low) when the internal chip enable signal CE$_i$-bar and the storage state indication signal RF/RC$_i$-bar are both at the H-level and the refresh signal RFSH-bar is at the L-level, as shown in Table 5 below.

TABLE 5

| CE$_i$-bar | RF/RC$_i$-bar | RFSH-bar | φ3-bar |
|---|---|---|---|
| H | H | L | L |
| otherwise | | | H |

The self-store mode timing control circuit 15 performs a store operation for the NVDRAM 1 in which the data has been recalled into the volatile state when no access command is input for an address included in the NVDRAM 1 and the refresh signal RFSH-bar indicates an refresh operation. The self-store mode timing control circuit 15 performs a refresh operation for the data stored at the volatile state and then a store operation is repeated for a predetermined times after the refresh operation is performed.

In a case where the chip enable signal CE-bar is at the H-level, a refresh operation (and a self-store operation if desired) may be performed for all the NVDRAMs 1 in which the data has been recalled, by changing the output enable signal OE-bar to the L-level. In a case where the chip enable signal CE-bar is at the H-level, a refresh operation (and a self-store operation if desired) may be automatically performed for all the NVDRAMs 1 in which the data has been recalled other than the NVDRAM 1 which is accessed, by controlling of the PC card interface circuit 2. Note that the accessed NVDRAM 1 has not been recalled.

Figure 6:
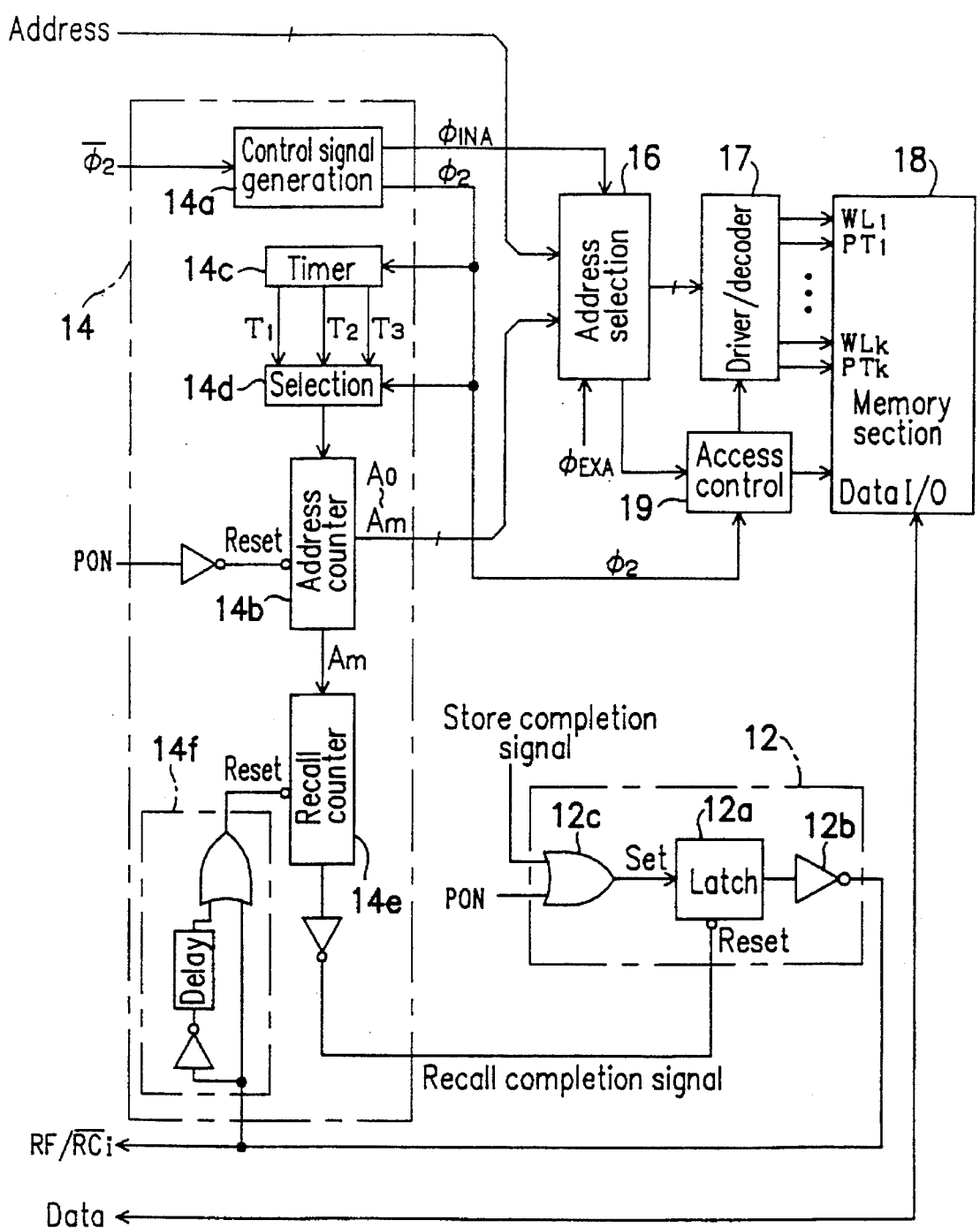
FIG. 6 is a block diagram showing a self-recall mode timing control circuit and the peripheral circuits in an embodiment of the present invention.
Figure 7:
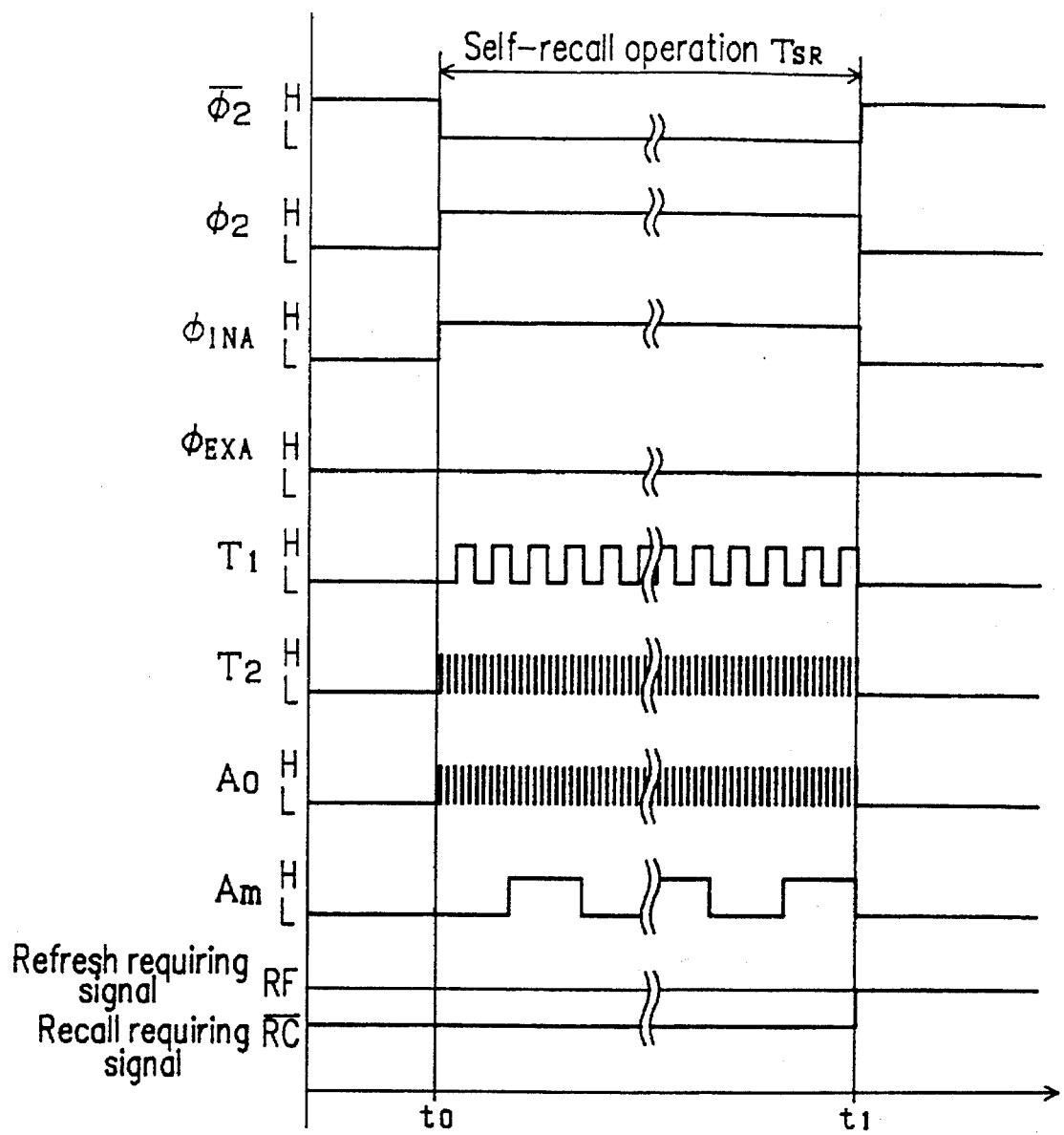
FIG. 7 is a timing chart describing an operation in the self-recall mode using the self-recall mode timing control circuit shown in FIG. 6.

The self-recall timing control circuit 14 will be described in detail with reference to FIGS. 6 and 7. As shown in FIG. 6, the recall mode signal φ2-bar is input to a control signal generation circuit 14a in the self-recall timing control circuit 14. The control signal Generation circuit 14a reverses the recall mode signal φ2-bar to Generate a recall mode signal φ2 and an internal address selection signal φINA. As shown in FIG. 7, when the recall mode signal φ2-bar changes to the L-level at the time t0, the recall mode signal φ2 and the internal address selection signal φINA both change to the H-level.

The internal address selection signal φINA is sent to the address selection circuit 16. The address selection circuit 16 selects an internal address A0, A1, . . . , Am generated by an address counter 14b instead of an external address (φEXA) input via the address bus. The selected internal address A0, A1, . . . , Am is output to the driver/decoder circuit 17.

The recall mode signal φ2 is sent to a timer circuit 14c, a selection circuit 14d, and the access control circuit 19. When the recall mode signal φ2 changes to the H-level, the timer circuit 14c generates three different clock signals T1, T2 and T3, respectively.

The clock signal T1 is a signal for the refresh operation, and the frequency $f_{T1}$ of the clock signal T1 is set to be relatively low in order to reduce a power consumption during the refresh operation. The clock signal T2 is a signal for the recall operation. The clock signal T3 is a signal for the store operation, and the frequency $f_{T3}$ of the clock signal T3 is set to be relatively high in order to perform the power-off store operation at a high speed. In this example, the periods (1/frequency) of the signals T1, T2 and T3 are set at 16 μsec, 2 μsec and 1 μsec, respectively. Accordingly, the frequency $f_{T2}$ of the clock signal T2 is significantly higher than that of the clock signal T1 (see FIG. 7).

The selection circuit 14d selects the clock signal T2 and sends it to the address counter 14b. The access control circuit 19 controls a plate line PT and a bit line BL in the recall mode based on the recall mode signal φ2 at the H-level. The address counter 14b counts an address value using the clock signal T2 input from the selection circuit 14d, and which is reset by a power-on signal PON which turns to the H-level for a short time (i.e. H-level pulse) when the power source is turned on.

As shown in FIG. 7, the least significant bit A0 of the address counter value changes synchronized with the clock signal T2 so as to have the frequency $f_{T2}$. The most significant bit Am of the address counter value changes with a frequency $f_{T2}/2^m$. The internal address A0 A1 ... Am is sent to the address selection circuit 16. In the memory section 18, each time the internal address A0 A1 ... Am changes, the recall operation is performed for every word line WL so as to transfer the data into the volatile state. When the address counter value completes a cycle in the address counter 14b, the whole data stored in the memory section 18 is recalled once.

The most significant bit Am is also sent to a recall counter 14e. The recall counter 14e counts the most significant bit Am in order to count a number of the recall operations performed for the memory section 18. When the counted number reaches to a predetermined number, the recall counter 14e outputs a recall completion signal to the recall requiring latch circuit 12.

The recall requiring latch circuit 12 has a latch circuit 12a capable of being set/reset including an RS flip-flop. The latch circuit 12a is reset by the recall completion signal, and then an output of the latch circuit 12a is inverted by the buffer inverter 12b and is output as the storage state indication signal RF/RC$_f$-bar at the H-level. As shown in FIG. 7, when the recall counter 14e has counted the predetermined number at the time t1, the storage state indication signal RF/RC$_f$-bar output from the recall requiring latch circuit 12 changes to the H-level (i.e. the refresh requiring signal RF). This makes the recall mode signal φ2-bar turn to the H-level (non-active), and the recall mode signal φ2 and the internal address selection signal φINA change to the L-level, resulting in that the timer circuit 14c stops generating the clock signals. Thus, the recall operation which starts at the time t0 is completed at the time t1, taking a time period $T_{SR}$.

The value of the recall counter 14e is reset by a signal from a pulse generating circuit 14f when the store operation for the memory section 18 is completed and the storage state indication signal RF/RC$_f$-bar changes to the L-level to be the recall requiring signal. The recall counter 14e is then ready to perform the next counting.

In the recall requiring latch circuit 12, as shown in FIG. 6, an OR gate 12c receives the store complete signal and the power-on signal PON. When an output of the OR gate 12c turns to the H-level, the latch circuit 12a is set, and a set state remains unchanged until the latch circuit 12a is reset by the recall completion signal.

Figure 8:
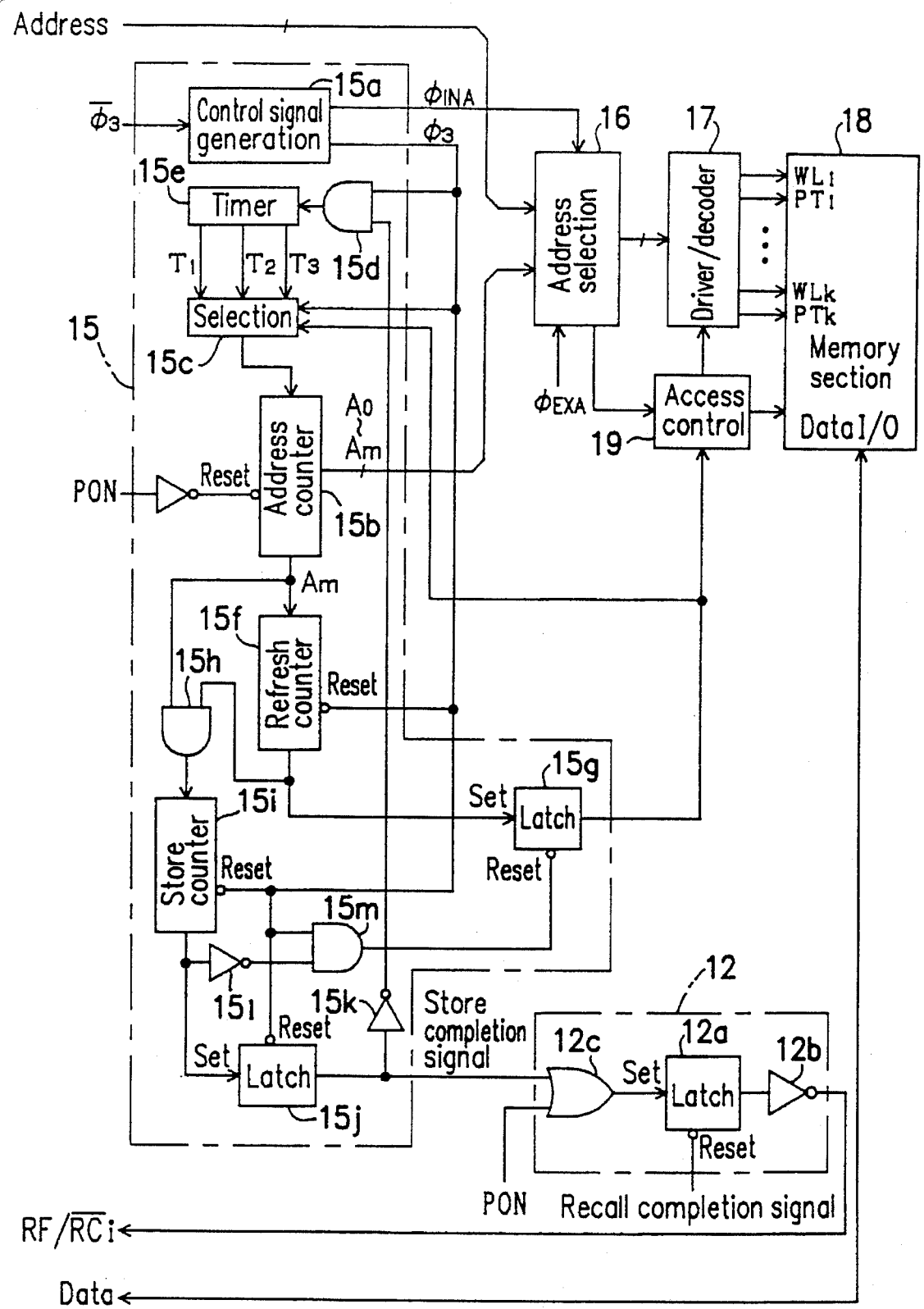
FIG. 8 is a block diagram showing a self-store mode timing control circuit and the peripheral circuits.
Figure 9:
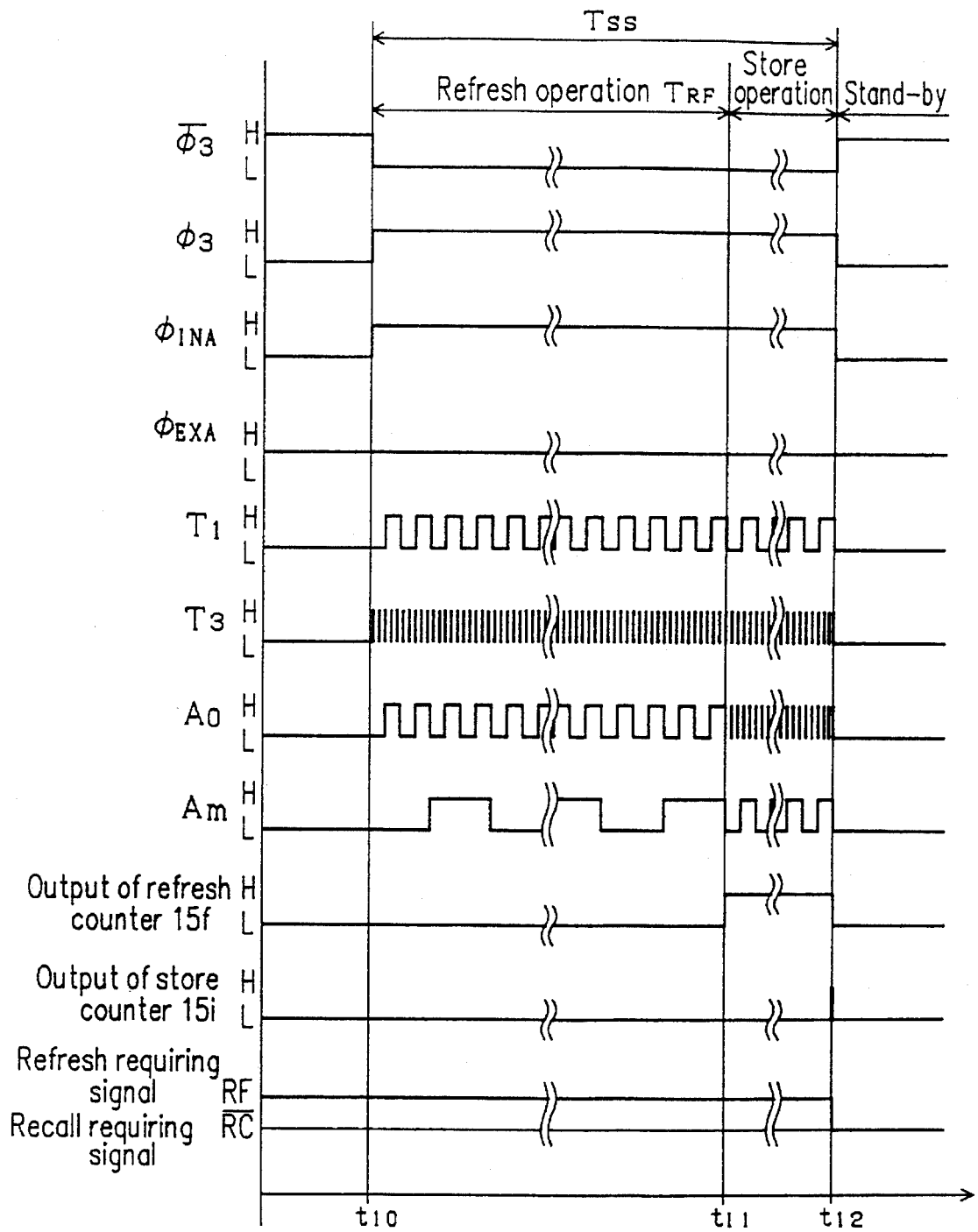
FIG. 9 is a timing chart describing an operation in the self-store mode.

The self-store timing control circuit 15 will be described in detail with reference to FIGS. 8 and 9. As shown in FIG. 8, the store mode signal φ3-bar is input to a control signal generation circuit 15a in the self-store timing control circuit 15. The control signal generation circuit 15a inverts the store mode signal φ3-bar to generate a store mode signal φ3 and an internal address selection signal φINA. As shown in FIG. 9, when the store mode signal φ3-bar changes to the L-level at the time t10, both of the store mode signal φ3 and the internal address selection signal φINA change to the H-level.

The internal address selection signal φINA is the same signal as in the self-recall mode timing control circuit 14, and is sent to the address selection circuit 16. The address selection circuit 16 selects an internal address A0, A1, ..., Am generated by an address counter 15b instead of an external address (φEXA) input via the address bus. The selected internal address A0, A1, ..., Am is output to the driver/decoder circuit 17.

The store mode signal φ3 is sent to a timer circuit 15e via an AND gate 15d, and a selection circuit 15c. When the store mode signal φ3 changes to the H-level, the timer circuit 15e generates three different clock signals T1, T2 and T3, respectively. These clock signals T1, T2 and T3 are the same as that explained for the self-recall mode timing control circuit 14.

The selection circuit 15c selects the clock signal T1 and sends it to the address counter 15b. The access control circuit 19 controls a plate line PT and a bit line BL in the refresh mode based on the store mode signal φ3 at the H-level. The address counter 15b counts an address value using the clock signal T1 input from the selection circuit 15c, and is reset by a power-on signal PON which changes to the H-level for a short time when the power source is turned on.

As shown in FIG. 9, the least significant bit A0 of the address counter value changes in accordance with the clock signal T1 so as to have the frequency $f_{T1}$. The most significant bit Am of the address counter value changes with a frequency $f_{T1}/2^m$. The internal address A0 A1 ... Am is sent to the address selection circuit 16. In the memory section 18, each time the internal address A0 A1 ... Am changes, the refresh operation is performed for every word line WL so as to refresh the data stored in the volatile state. When the address counter value complete a cycle in the address counter 15b, the whole data stored in the memory section 18 is refreshed once.

The most significant bit Am is also provided to a refresh counter 15f. The refresh counter 15f counts the most significant bit Am in order to count a number of the refresh operation performed for the memory section 18. When the counted number reaches to a predetermined number, the refresh counter 15f changes the output of the most significant bit Am to the H-level so as to set a latch circuit 15g. An output of the latch circuit 15g is sent to the selection circuit 15c and the access control circuit 19.

When the output of the latch circuit 15c changes to the H-level, the selection circuit 15c changes its output signal from the clock signal T1 to the clock signal T3, and the access control circuit 19 changes its operation mode from the refresh mode to the store mode. In the memory section 18, each time the internal address A0 A1 ... Am changes, the store operation is performed for every word line WL so as to transfer the data stored in the volatile state into the non-volatile state. When the counted address value takes a round in the address counter 15b, the whole data in the memory section 18 is stored in the non-volatile state.

As shown in FIG. 9, the refresh operation takes a time period $T_{RF}$ from the time t10 to a time t11. When the refresh counter 15*f* has counted the predetermined number at the time t11, the output of the refresh counter 15*f* turns to the H-level. This causes the changing frequencies of the least and the most significant bits A0 and Am so as to be the high frequency $f_{T3}$ of the clock signal T3, resulting in a store operation at a high speed.

The most significant bit Am of the address counter 15*b* and a most significant bit of the counted value of the refresh counter 15*f* are also sent to a store counter 15*i* via an AND gate 15*h*, as shown in FIG. 8. The store counter 15*i* counts a number of the store operation performed for the memory section 18 by counting the most significant bit Am output from the address counter 15*b* after the refresh counter 15*f* has count a predetermined number of the refresh operation.

When the counted number of the store operation reaches to a predetermined number at the time t12, the output from the store counter 15*i* (the most significant bit) changes to the H-level so as to set a latch circuit 15*j*. An output of the latch circuit 15*j* is sent to the recall requiring latch circuit 12 as the store completion signal. Accordingly, the storage state indication signal RF/RC$_i$-bar output from the recall requiring latch circuit 12 changes to the L-level so as to be the recall requiring signal.

As a result, as shown in FIG. 9, when the output of the store counter 15*i* changes to the H-level at the time t12, the storage state indication signal RF/RC$_i$-bar output from the recall requiring latch circuit 12 changes to the L-level (i.e. the recall requiring signal RC-bar). This makes the store mode signal φ3-bar return to the H-level (non-active), and the store mode signal φ3 and the internal address selection signal φINA return to the L-level, with the result that the timer circuit 15*e* stops outputting the clock signals. Thus, the refresh and self-store operations are completed taking a time period $T_{SS}$ form the time t10 to the time t12. The count value of the refresh counter 15*f* and the store counter 15*i* are set at the initial value by the store mode signal φ3 returning to the L-level.

In this example, when the storage state indication signal RF/RC$_i$-bar changes to the L-level to be the recall requiring signal, the control signal input circuit 11 sets the store mode signal φ3-bar at the H-level. However, the store mode signal φ3 may remain at the L-level after the store operation is completed. In this case, since the output of the latch circuit 15*j* also sent to the AND gate 15*d* via an inverter 15*k*, the timer circuit 15*e* can stop outputting the clock signals though the store mode signal φ3 remain at the H-level. Furthermore, since the latch circuit 15*g* is reset by a signal from an AND gate 15*m* when the output of the store counter 15*i* turns to the H-level, the selection circuit 15*c* and the access control circuit 19 can return to the initial state. The latch circuit 15*g* is also reset by the signal from the AND gate 15*m* when the store mode signal φ3-bar returns to the H-level and the store mode signal φ3 returns to the L-level.

Returning to FIG. 9, if the store mode signal φ3-bar returns to the H-level (non-active) before the time t11, the timer circuit 15*e* stops outputting the clock signals and both of the refresh counter 15*f* and the store counter 15*i* are reset, with the result that the refresh operation is performed but the store operation is not performed. Therefore, giving successive L-level pulses to the refresh signal RFSH-bar during a time period less than the time period $T_{RF}$ allows repetition of the refresh operation.

Figure 10:
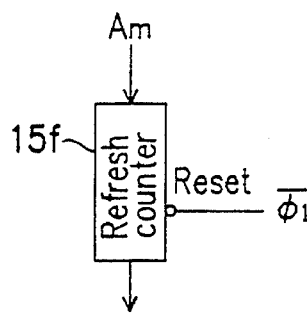
FIG. 10 is a diagram showing a portion of the self-store mode timing control circuit.

FIG. 10 shows an alternative configuration of the refresh counter 15*f*, wherein resetting of the refresh counter 15*f* is performed by using the volatile mode signal φ1-bar instead of the store mode signal φ3-bar. In this case, when the successive L-level pulses are given to the refresh signal RFSH-bar during the short time period, the count value of the refresh counter 15*f* is incremented so long as no access operation is performed for the NVDRAM 1 during the period. Accordingly, the store operation is performed for the NVDRAM 1 after a certain number of the L-level pulses occur in the refresh signal RFSH-bar. In this case, the NVDRAM 1 which is not frequently accessed is automatically subjected to a store operation without any explicit requirement for the store operation.

In a case where the refresh signal RFSH-bar is set at the L-level during the time period $T_{SR}$ of the self-recall operation performed for one of the NVDRAMs 1 by the self-recall mode timing control circuit 14, the refresh operation is performed by the self-store mode timing control circuit 15 for other NVDRAMs 1 which have been recalled.

By setting the time period $T_{RF}$ for refresh operation shorter than the time period $T_{SR}$ for self-recall operation, any NVDRAM 1 which has been recalled is subjected to the self-store operation when another NVDRAM 1 is accessed and self-recalled. In this case, only one of the NVDRAMs 1 has been self-recalled and the data stored in the NVDRAM 1 remains at the volatile state. However, the number of the NVDRAMs 1 which have been self-recalled and stores the data in the volatile manner is not limited to one.

As mentioned above, the self-recall mode timing control circuit 14 and the self-store mode timing control circuit 15 has been described as two separate circuits for purposes of clear explanation. However, since these timing control circuits 13, 14 and 15 include circuits used commonly such as timer circuits and counters, these timing control circuits 13, 14 and 15 may be implemented combined with each other.

In this example, since the self-recall and the self-store operation are performed every word line WL (i.e. by the page as a unit), a data transfer ratio of the self-recall and self-store operations is significantly higher than that of operations performed for every bit (note a case where 1024 memory cells are included in a page).

A useful life of NVDRAM 1 of the present invention will be estimated as follows: in a case where each NVDRAM 1 has 1024 word lines and the self-recall operation is performed for all the word lines twice, the time period $T_{SR}$ equals to about 4 m sec with the clock cycle T2 of 2 μsec (2 μsec×1024×2). Each memory cell may be subjected to one polarization reversal per time period $T_{SR}$ on the average, with a polarization reversal probability of ½ per one performance of the recall operation. Accordingly, if the maximum times of the available polarization is $10^{11}$ and the time period $T_{SR}$ is 4 msec, the NVDRAM 1 can be used for $4\times10^8$ sec, i.e., about 10 years.

In this example, since the self-recall operation, the self-store operation and the refresh operation are performed by using the different clock signals having respective cycles, the operation time periods of these operations can be optimized.

Next, the operation of the NVDRAM 1 will be explained with reference of FIGS. 11 to 14.

Figure 11:
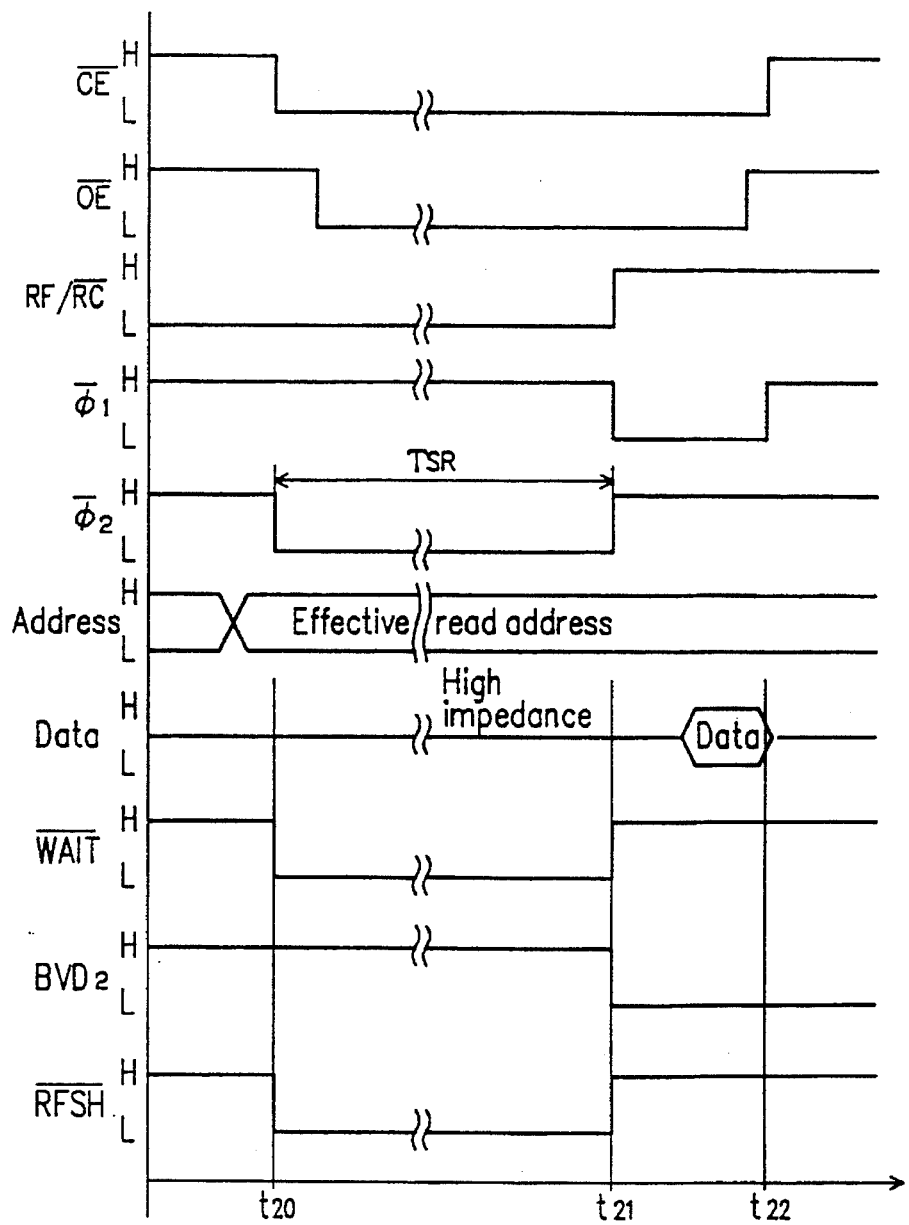
FIG. 11 is a timing chart describing a read access operation when self-recall is performed.

FIG. 11 shows a read operation by accessing the NVDRAM 1 which has not been recalled. When an access command is input, an address in the NVDRAM 1 is addressed and the chip enable signal CE-bar for the NVDRAM 1 is changed to the L-level (enable) at time t20. In accordance with the storage state indication signal RF/RC$_i$-bar at the L-level (i.e., recall requiring signal), the recall mode signal φ2-bar changes to the L-level and a self-recall operation is performed during the time period $T_{SR}$, while the output enable signal OE-bar changes to the L-level. Next, when the storage state indication signal RF/RC$_i$-bar changes to the H-level (i.e., refresh requiring signal) at time t21, the recall mode signal φ2-bar returns to the H-level and the volatile mode signal φ1-bar changes to the L-level, whereby the data recalled in the volatile state in the NVDRAM 1 is read out onto the data bus. After the data on the data bus is read by a peripheral circuit through the PC card interface circuit 2, the chip enable signal CE-bar for the NVDRAM 1 is returned to the H-level at time t22 and the volatile mode signal φ1-bar returns to the H-level, whereby the access and read operation of the data stored in the NVDRAM 1 is completed.

Accordingly, the peripheral circuit is not required to detect whether the NVDRAM 1 has been recalled or not in order to change the access mode in the volatile manner or the non-volatile manner. The peripheral circuit can perform the access operation for all of the NVDRAMs 1 in the same manner, similar to that for the pseudo-SRAM. In addition, the NVDRAM 1 which has not been recalled needs no refresh operation, resulting in the saving of the power consumption.

Figure 12:
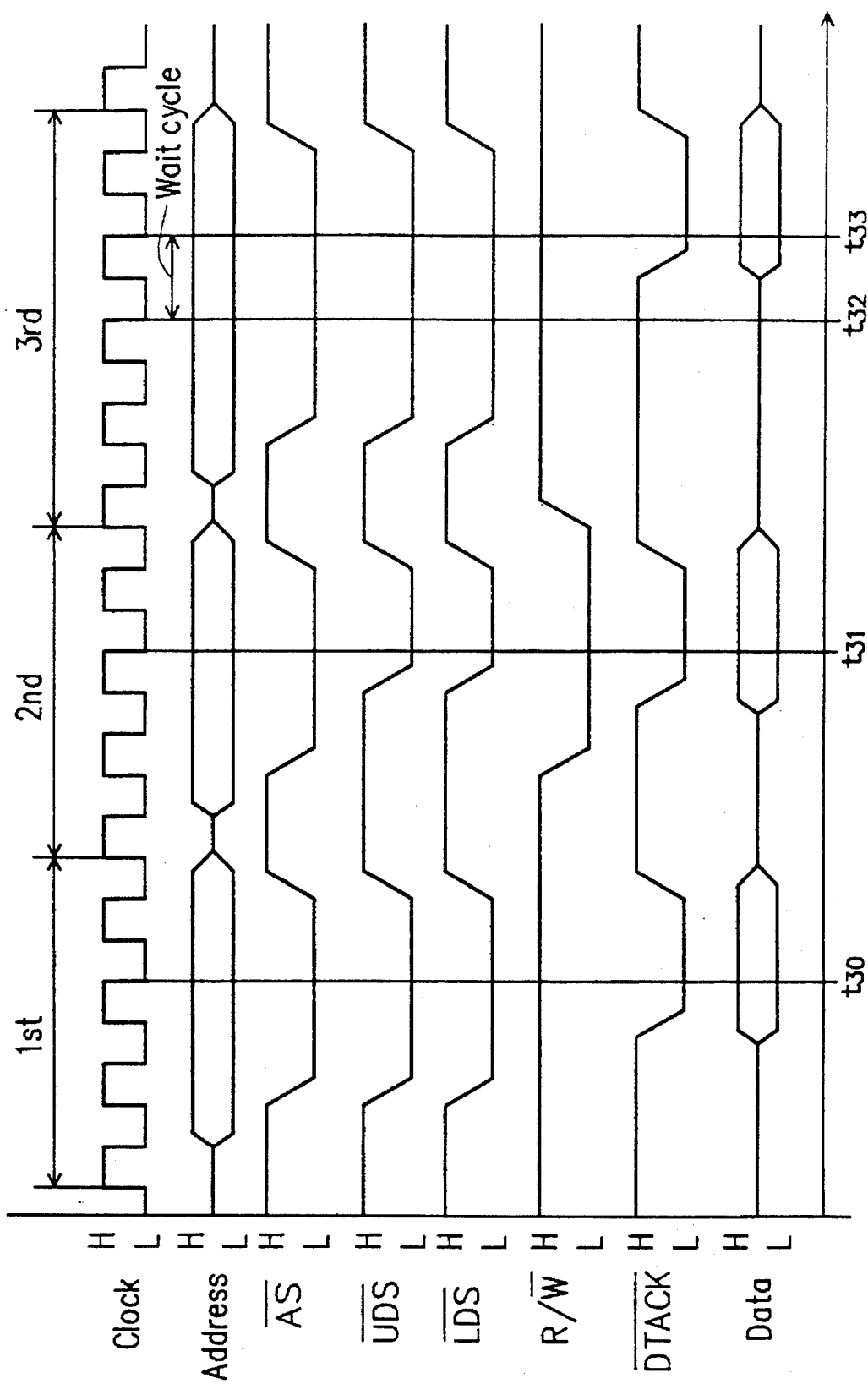
FIG. 12 is a timing chart describing a bus cycle of an MPU.

Since the wait signal WAIT-bar is also at the L-level during the time period $T_{SR}$, the peripheral circuit can detect the wait signal WAIT-bar so as to insert a wait cycle into the bus cycle until the data is output to the data bus after the time t21. The wait signal WAIT-bar may be accepted by almost any kind of computer systems and microprocessors, resulting in the compatibility of the present invention. Signals from the peripheral circuit, for example, of the MC68000 (16 bit MPU offered by Motorola) as shown in FIG. 12, are usable for control signals input to the present invention. The correspondence between these signals is shown in the following Table 6.

TABLE 6

| Signals of MC68000 | Corresponding signals of the present invention |
| --- | --- |
| address strobe signal AS-bar | chip enable signal CE-bar |
| data strobe signals UDS-bar and LDS-bar | output enable signal OE-bar |
| read/write signal R/W-bar | write enable signal WE-bar |
| data transfer acknowledge signal DTACK-bar | inverse of wait signal WAIT-bar |

As shown in FIG. 12, the microprocessor detects the data transfer acknowledge signal DTACK-bar at time t30, time t31, and time t32. At the time t30 and the t31 during a first cycle of read operation and a second cycle of write operation, the data transfer acknowledge signal DTACK-bar is at the L-level (active) and the access operation is continued. However, the data transfer acknowledge signal DTACK-bar at the time t32 in a third cycle of read operation remains at the H-level, so that a wait cycle is inserted. When the data transfer acknowledge signal DTACK-bar is detected at the L-level at time t33, the access operation is continued again. Accordingly, by sending the inverted signal of the wait signal WAIT-bar to this type of the microprocessor, a delay in timing of the access operation due to the recall operation may be recovered.

During the time period $T_{SR}$ the refresh signal RFSH-bar is also at the L-level, so that the refresh operation may be performed for the data stored in the volatile state in other NVDRAMs 1 which has been recalled. This may avoid the problem that no refresh operation is performed by a refresh command during the time when the peripheral circuit is busy to perform the self-recall operation.

In a case that the time period $T_{RF}$ for refresh operation until the store operation begins is set shorter than the time period $T_{SR}$ for the self-recall operation, the data stored in the volatile state in the NVDRAM 1 which has been recalled can be subjected to the self-store operation so that the data is transferred into the non-volatile state before the next self-recall operation. Therefore, the number of the NVDRAMs 1 which has recalled and need to be refreshed does not exceed one so as to reduce the power consumption due to the refresh operation. This advantage is significant for a portable information device which has a limited power supply.

The internal chip enable signal generation circuit 21 of the PC card interface circuit may be implemented so as to perform a self-store operation for one of the NVDRAMs 1 before setting the internal chip enable signal $CE_i$-bar at the L-level for another NVDRAM 1 when the chip enable signal CE-bar changes to the L-level. Since the self-store operation and the self-recall operation are not performed at the same time, this is more advantageous for the portable information devices. The self-store operation may be performed after the self-recall operation.

Figure 13:
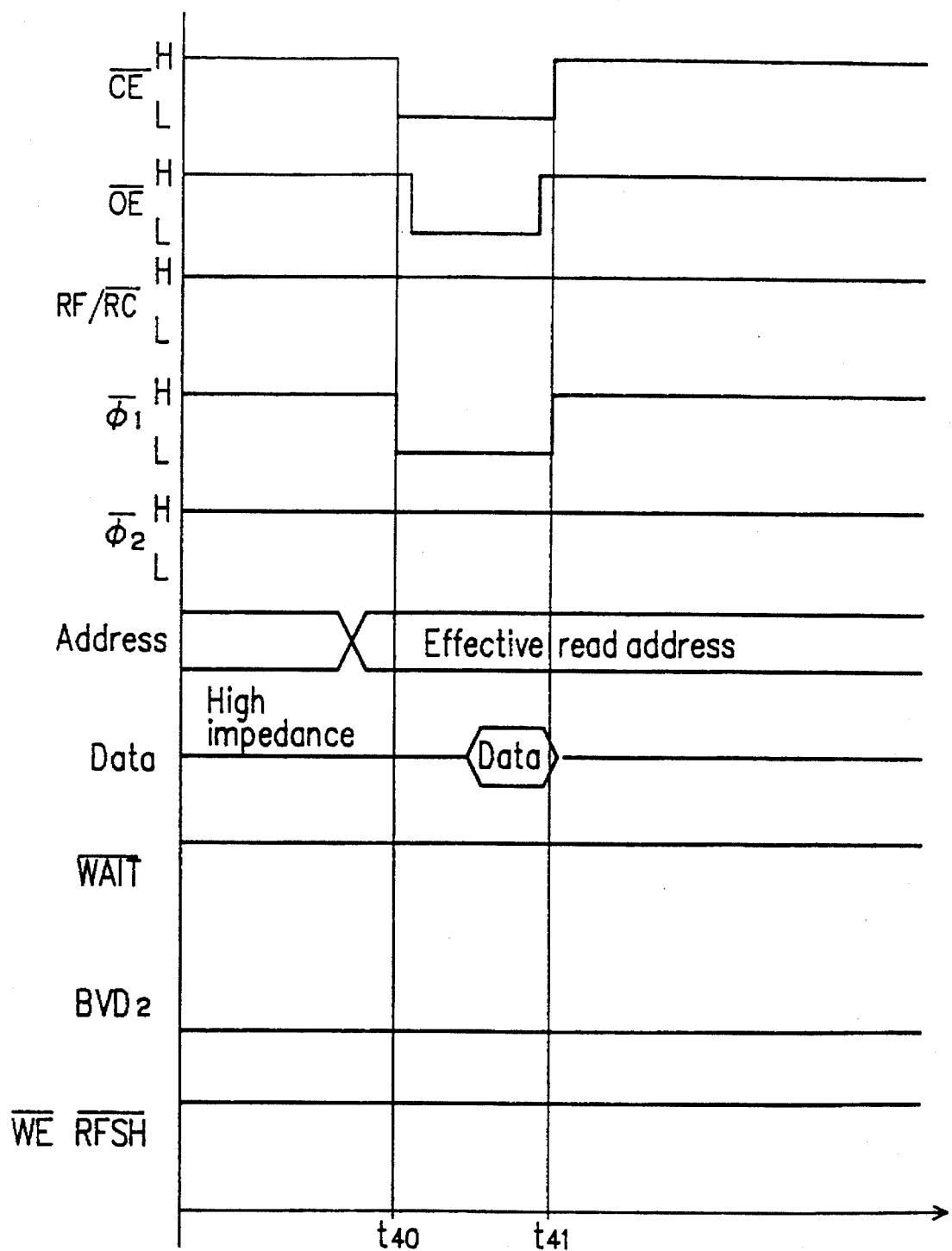
FIG. 13 is a timing chart describing a read access operation.

FIG. 13 shows a read operation by accessing the NVDRAM 1 which has been recalled. When an access command is input, an address in the NVDRAM 1 is addressed and the chip enable signal CE-bar for the NVDRAM 1 is changed to the L-level (enable) at time t40. In accordance with the storage state indication signal RF/RC$_i$-bar at the H-level (i.e., refresh requiring signal), the volatile mode signal φ1-bar turns to the L-level so that the data stored in the volatile state in the NVDRAM 1 is read out onto the data bus, as in the case after the time t21 shown in FIG. 11. After the data on the data bus is read by the peripheral circuit, the chip enable signal CE-bar for the NVDRAM 1 is returned to the H-level at time t41 and the volatile mode signal φ1-bar returns to the H-level, whereby the access (read) operation is completed. In this case, the access operation is performed at a high speed without wasting time due to the recall operation.

Figure 14:
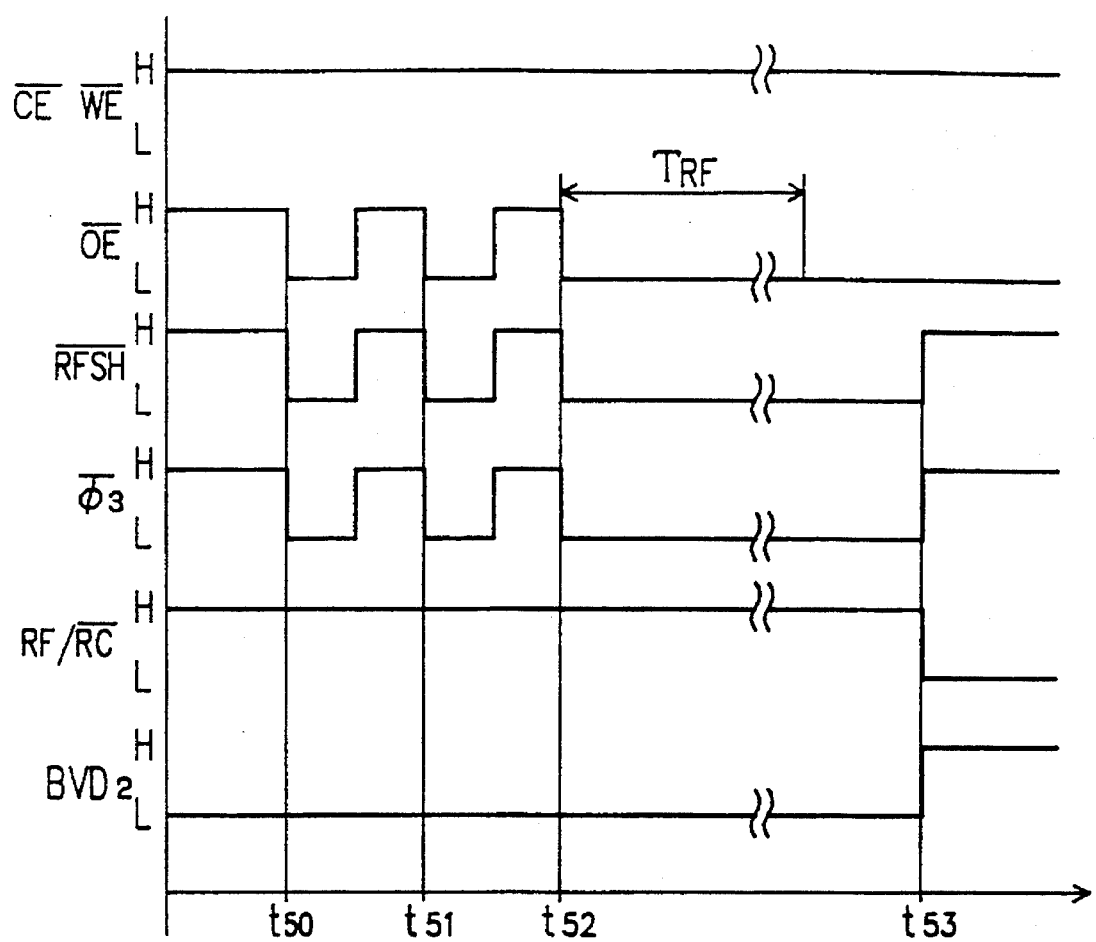
FIG. 14 is a timing chart describing a refresh operation.

FIG. 14 shows a refresh operation and a self-store operation for the NVDRAM 1 which has been recalled. When the output enable signal OE-bar is set at the L-level for a short time period (significantly shorter than the time period $T_{RF}$) at time t50 and time t51 (i.e. L-level pulses at the time t50 and time t51) with the chip enable signal CE-bar remaining at the H-level, the refresh signal RFSH-bar and the store mode signal φ3-bar change to the L-level, so that the refresh operation is performed for the data in the NVDRAM 1 which has been recalled during each short time period.

When the output enable signal OE-bar is set at the L-level for a time period longer than the time period $T_{RF}$ from time t52, with the chip enable signal CE-bar remaining at the H-level, the refresh signal RFSH-bar and the store mode signal φ3-bar change to the L-level, so that the refresh operation is performed for the time period $T_{RF}$ from the time t52 and then the self-store operation is performed.

When the storage state indication signal RF/RC$_i$-bar returns to the L-level (i.e., recall requiring signal) at time t53, the refresh signal RFSH-bar and the store mode signal φ3-bar returns to the H-level so that the store operation is completed and the NVDRAM 1 comes into a stand-by state in which the data is stored in the non-volatile state. In a case where all of the storage state indication signals RF/RC$_i$-bar (i=1, 2, . . . , n) output from the corresponding NVDRAMs 1 are at the L-level (i.e. recall requiring signal), the second backup voltage detection signal BVD2 changes to the H-level. It can be ensured that no data is lost by turning off the power by detecting the second backup voltage detection signal BVD2 at the H-level.

In this example, a self-store operation is performed, if necessary from the detection of the second backup voltage detection signal BVD2, before the power is turned off. Alternately, the self-store operation may be performed automatically by detecting a turning off of the power as described in Japanese Laid-Open Patent Application No. 4-87099.

The refresh signal generation circuit 22 may be implemented to perform the self-store operation by automatically setting the refresh signal RFSH-bar at the L-level when the second backup voltage detection signal BVD2 remains at the L-level during a certain time period and the refresh signal RFSH-bar has been at the H-level during the time period.

An alternate configuration of the self-store timing control circuit 15 will be described with reference to FIGS. 15 and 16. The same elements as shown in FIG. 8 have the same numerical references.

Figure 15:
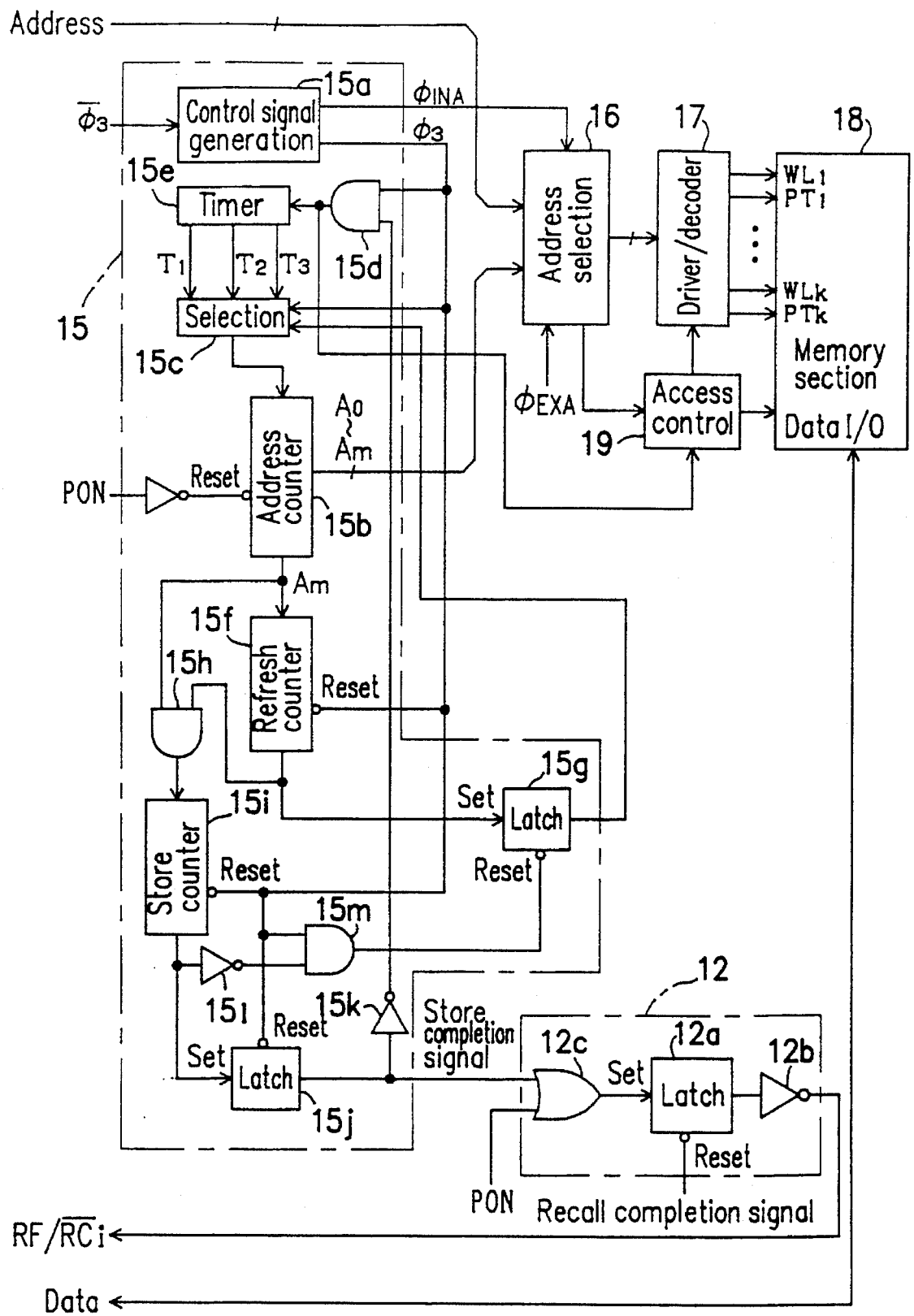
FIG. 15 is a block diagram showing a self-store mode timing control circuit and the peripheral circuits in another embodiment of the present invention.
Figure 16:
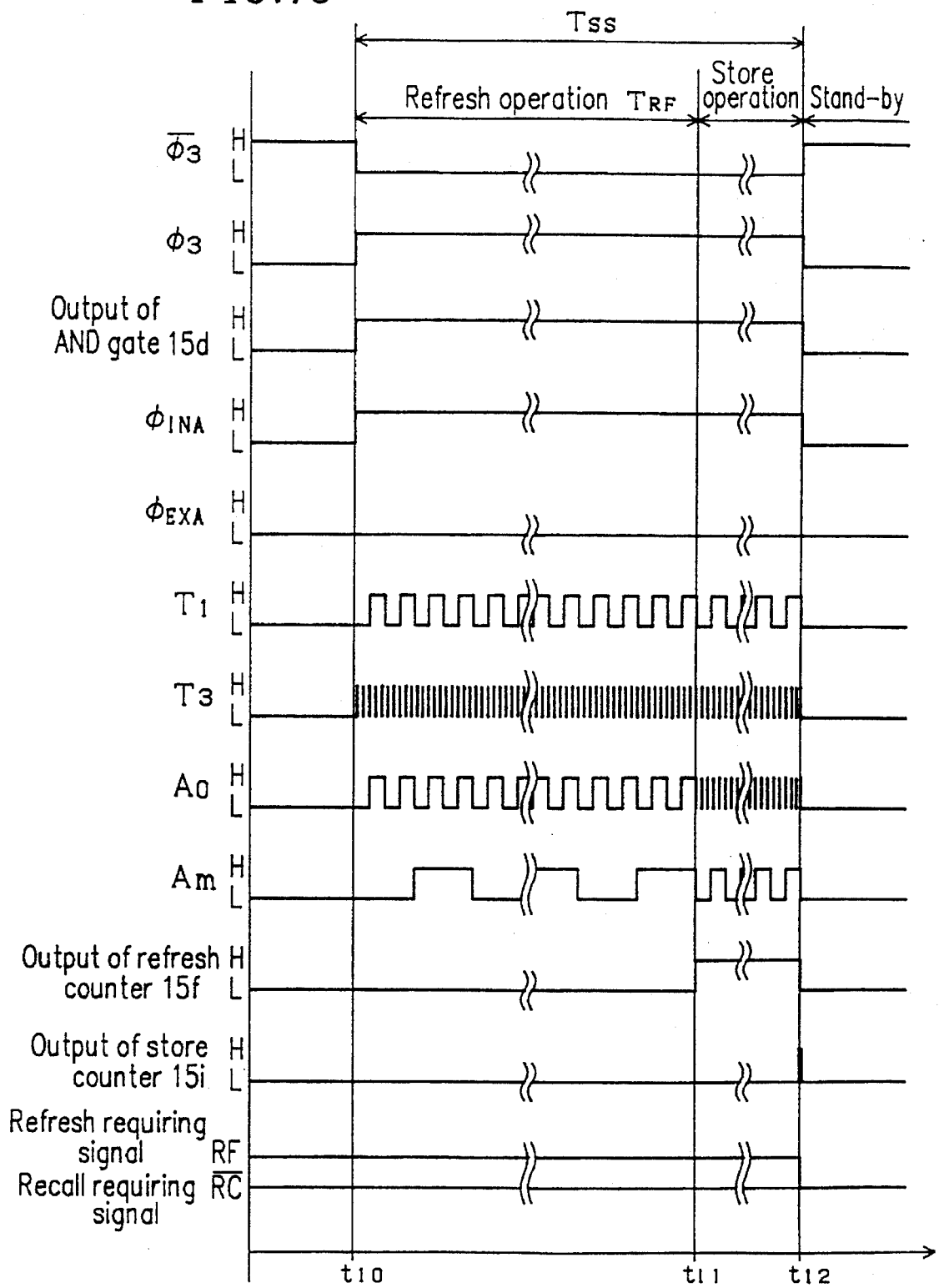
FIG. 16 is a timing chart describing an operation in the self-store mode using the self-store mode timing control circuit shown in FIG. 15.

In the self-store timing control circuit 15 shown in FIG. 15, the access control circuit 19 receives the output signal from the AND gate 15*d* instead of the output signal from the latch circuit 15*g* as shown in FIG. 8. In this configuration, the access control circuit 19 controls the operations in the store mode during a time period from when the timer circuit 15*e* begins outputting the clock signals based on the store mode signal φ3-bar changing to the L-level until when the timer circuit 15*e* stops outputting the clock signals based on the output signal from the latch circuit 15*j*. Accordingly, as shown in FIG. 16, the self-store operation is performed for the whole of the time period $T_{SS}$ wherein the refresh counter 15*f* and the store counter 15*i* perform the count operation in accordance with the clock signals T1 and T2, respectively.

Figure 17:
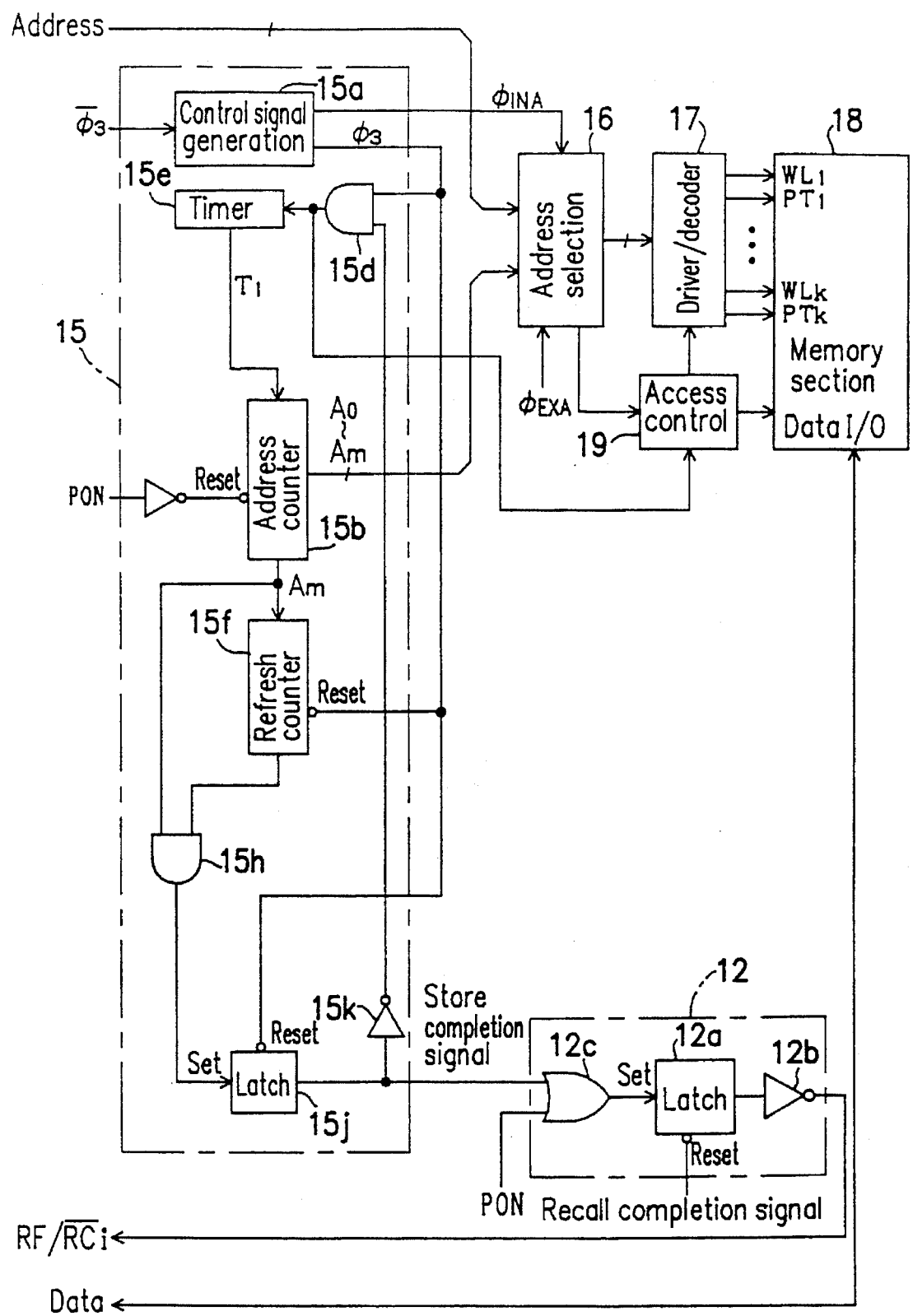
FIG. 17 is a block diagram showing a self-store mode timing control circuit and the peripheral circuits in still another embodiment of the present invention.
Figure 18:
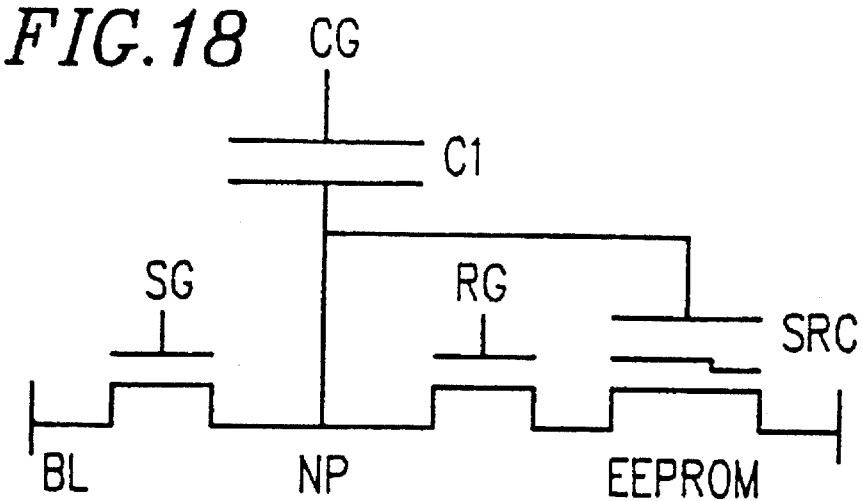
FIG. 18 is a diagram showing an equivalent circuit of a memory cell having an EEPROM and a DRAM.
Figure 19:
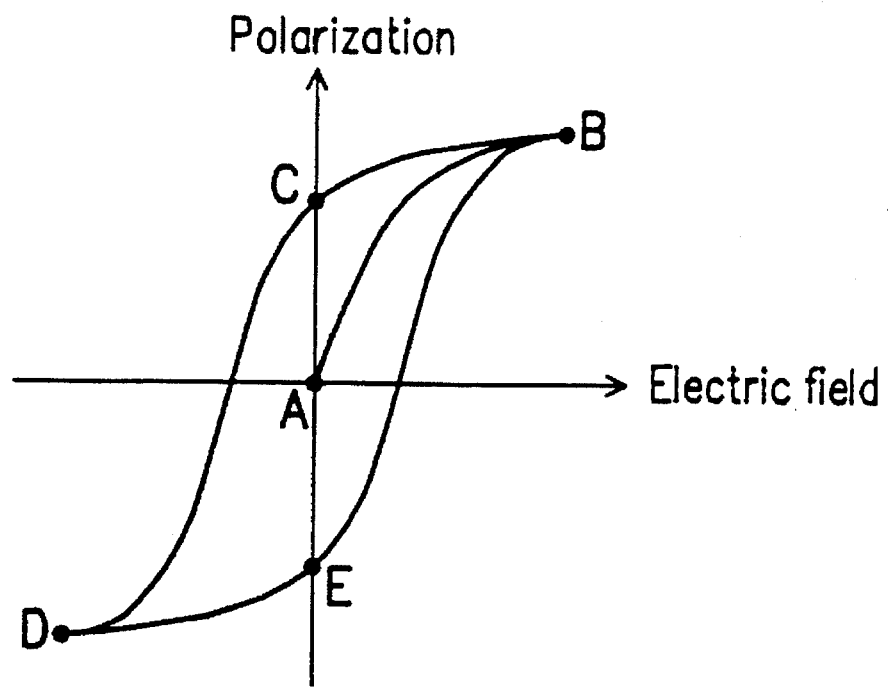
FIG. 19 is a diagram showing the hysteresis characteristics of a ferroelectric material.
Figure 20:
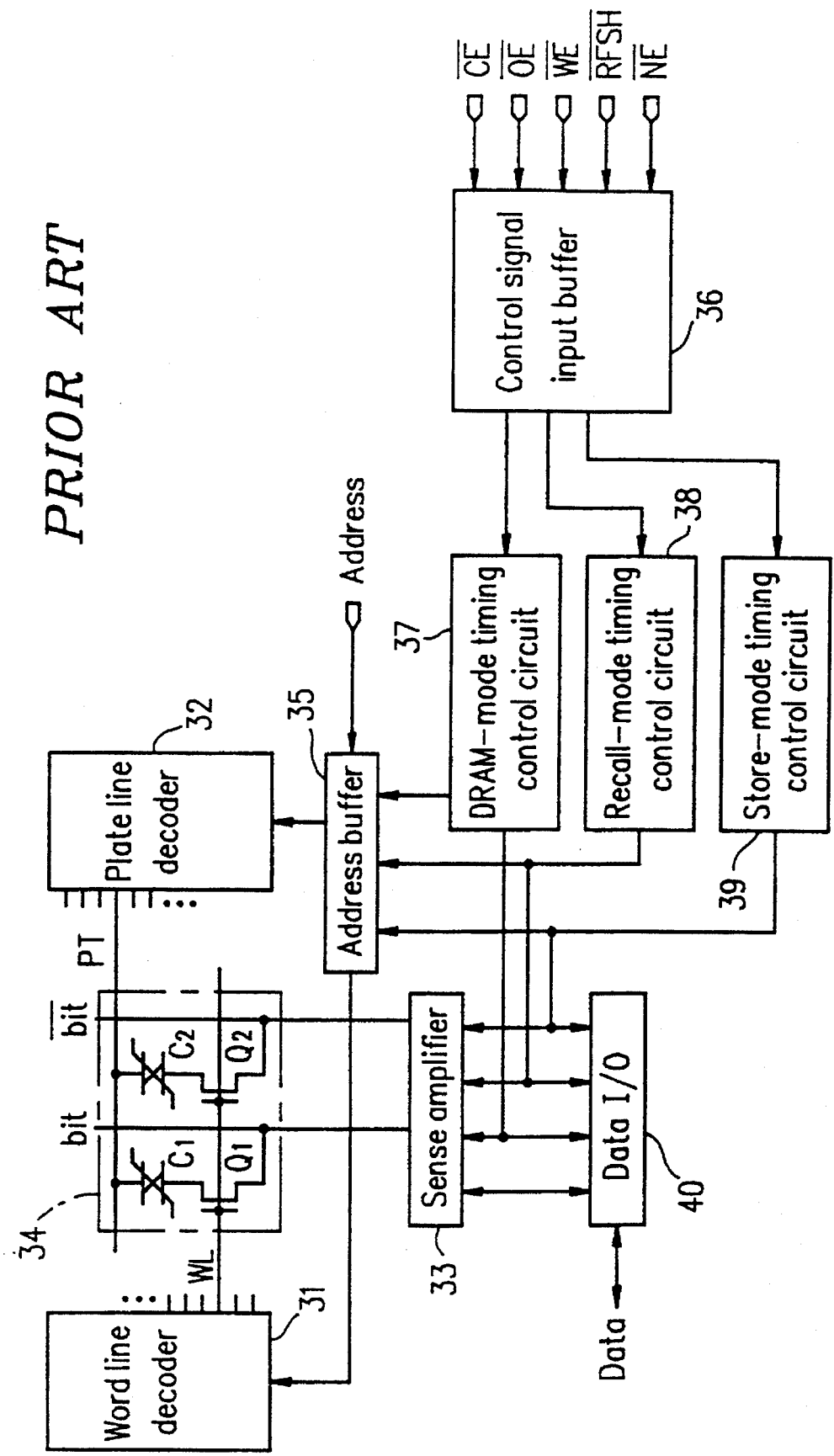
FIG. 20 is a block diagram showing a configuration for a conventional NVDRAM in which a ferroelectric material is used.
Figure 21:
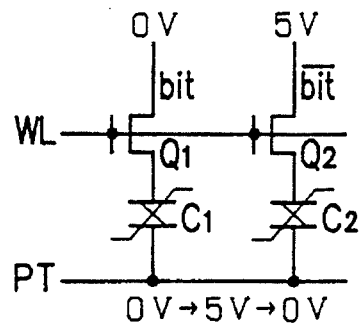
FIG. 21 is a diagram for describing an operation in a case where data "0" is written in a memory cell using an ferroelectric material in a store mode.
Figure 22:
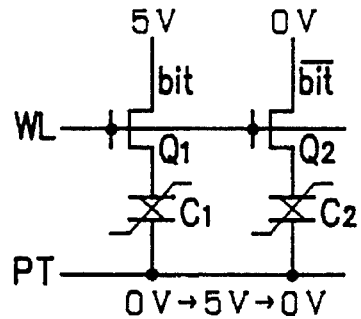
FIG. 22 is a diagram for describing an operation in a case where data "1" is written in a memory cell using an ferroelectric material in a store mode.
Figure 23:
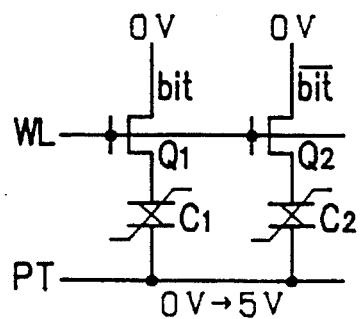
FIG. 23 is a diagram for describing an operation in a case where data is read from a memory cell using an ferroelectric material in a recall mode.
Figure 24:
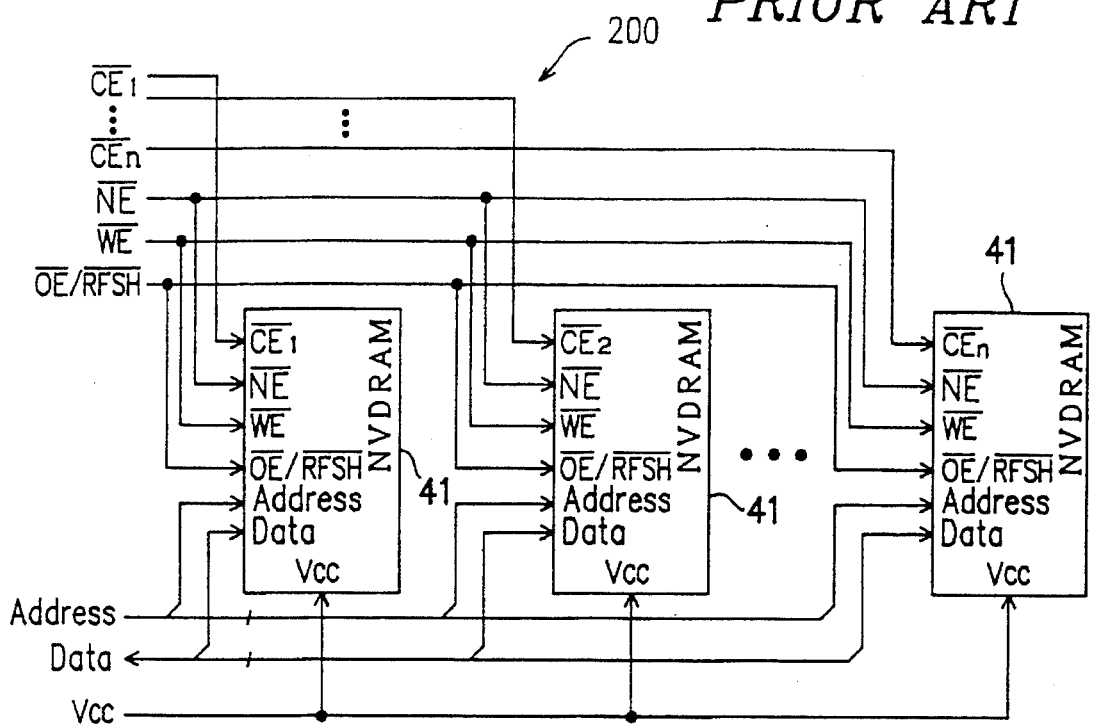
FIG. 24 is a block diagram showing an overall configuration of a conventional non-volatile dynamic random access memory.
Figure 25:
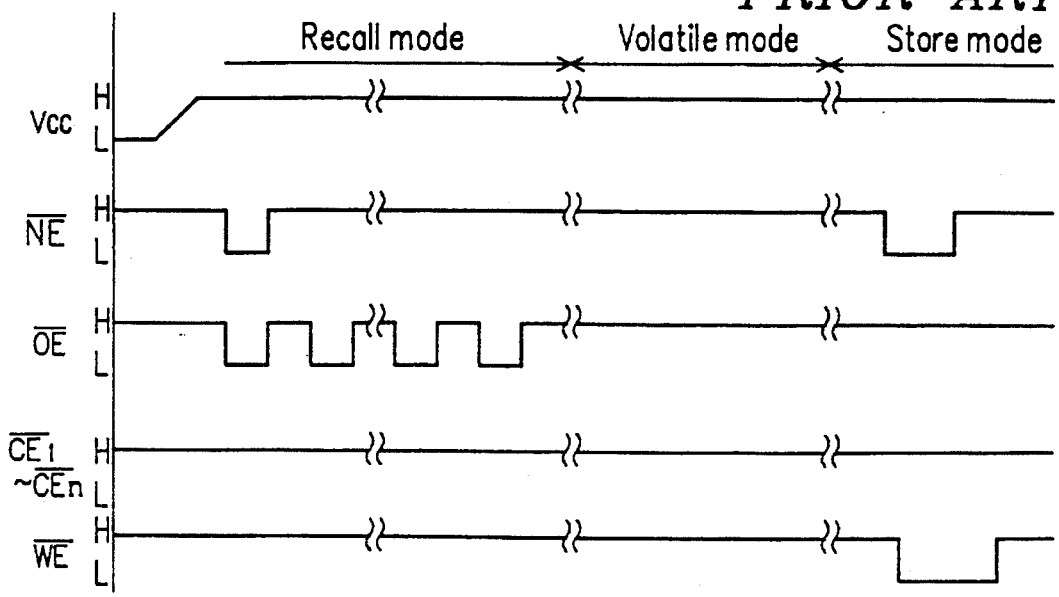
FIG. 25 is a timing chart describing an operation of a conventional non-volatile dynamic random access memory.

Another alternate configuration of the self-store timing control circuit 15 is shown in FIG. 17. The same elements as shown in FIG. 15 have the same numerical references. In this case, only the refresh counter 15*f* performs the count operation instead of both of the refresh counter 15*f* and the store counter 15*i* performing the count operation as shown in FIG. 15.

The non-volatile semiconductor memory device 100 has been described as the device including n NVDRAMs 1 and the PC card interface 2. However, the present invention may apply to a single NVDRAM memory device or a whole or a part of a memory module incorporated into a single-chip microcomputer. The memory cells in each NVDRAM 1 may be one-transistor/cell type or another type instead of the two-transistor/cell type as described above. The one-transistor/cell type memory cell is described in, for example, U.S. Pat No. 5,381,379. In addition, a combination type NVDRAM (EEPROM and DRAM) may be used for the NVDRAM 1. A row address strobe signal RAS-bar and a column address strobe signal CAS-bar may be used as the chip enable signal CE-bar.

According to the present invention as described above, a power consumption for retaining the data stored in the volatile state can be reduced, by selectively recalling the NVDRAM which is accessed.

According to the present invention, the NVDRAM is controlled by using standardized signals without a specific signal such as a conventional non-volatile enable signal NE-bar, since an explicit recall command is not required in the present invention. This makes the control of the NVDRAM easy and results in a convenient memory device for which the interface circuit is implemented easily.

In addition, the storage state (volatile or non-volatile) of each NVDRAM (i.e., the recall operation has been performed or not) is indicated by latch circuits. Therefore, the data storage state (the operation mode) is easily managed in a case of a memory array including a plurality of the NVDRAMs. By using the indication, a requirement for the store operation before turning off the power is easily detected.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including:

memory means for storing data having volatile and non-volatile capability;

access means for reading/writing the data stored in a volatile state at an address in said memory means in accordance with an access command indicating the address;

transfer means for transferring the data stored in said memory means from the volatile state into a non-volatile state; and recall means for recalling the data stored in said memory means in the non-volatile state into the volatile state, wherein said recall means selectively performs a recall operation for a section of said memory means which includes the address before said access means performs a read/write operation for the data, when the data at the address is stored in the non-volatile state.

2. A semiconductor memory device including:

memory means for storing data having volatile and non-volatile capability;

access means for reading/writing the data stored in a volatile state at an address in said memory means in accordance with an access command indicating the address;

transfer means for transferring the data stored in said memory means from the volatile state into a non-volatile state;

recall means for recalling the data stored in said memory means in the non-volatile state into the volatile state;

means for indicating if recall operation has been performed, after either supplying power to said semiconductor memory device or a last transfer operation has been performed; and means for controlling said access means and said recall means based on an indication of said indicating means, whereby in a case where said indication is positive, said access means performs a read/write operation for the data stored at the address, and in a case where said indication is negative, said recall means selectively performs a recall operation for a section of said memory means which includes the address before said access means performs a read/write operation for the data.

3. A semiconductor memory device according to claim 2, wherein said control means controls said transfer means whereby, in a case where said indication is negative for a first section of said memory means including the address and is positive for a second section of said memory means other than the first section, said transfer means performs a transfer operation for the data stored in at least a part of the second section.

4. A semiconductor memory device according to claim 3, wherein said transfer operation for the second section is performed during said recall operation for the first section is performed.

5. A semiconductor memory device according to claim 3, wherein said transfer operation for the second section is performed before or after said recall operation for the first section is performed.

6. A semiconductor memory device according to claim 3, wherein said control means controls said transfer means, whereby said transfer means performs the transfer operation when a total amount of addresses included in the second section is larger than a predetermined value.

7. A semiconductor memory device according to claim 2, including means for generating a wait signal, the wait signal being output at least during said recall means performs the recall operation.

8. A semiconductor memory device according to claim 2, including means for generating a store requiring signal for a section of said memory means, the store requiring signal being output in a case where said indication is positive for any address included in the section.

9. A semiconductor memory device according to claim 2, wherein said memory means includes a first portion for storing the data in a volatile manner and a second portion for storing the data in a non-volatile manner.

10. A semiconductor memory device according to claim 2, wherein said memory means includes a memory cell which changes the capability between volatile and non-volatile based on a voltage applied to said memory cell.

11. A semiconductor memory device according to claim 9, wherein said memory means includes a DRAM portion and an EEPROM portion.

12. A semiconductor memory device according to claim 10, wherein said memory cell includes a ferroelectric material.

13. A semiconductor memory device according to claim 3, including means for refreshing the data stored in the volatile state in the second section of said memory means, during said recalling means performs the recall operation for the first section.

14. A semiconductor memory device according to claim 13, further including:
  means for counting a number of refresh operations successively performed for an address by said refresh means; and
  means for controlling said transfer means based on the number of the refresh operations, whereby said transfer means performs the transfer operation for the address when the number is larger than a predetermined value.

15. A semiconductor memory device according to claim 14, wherein said counting means counts a number of the refresh operations performed after a last read/write operation is performed.

16. A method for driving a semiconductor memory device including memory means for storing data having volatile and non-volatile capability, comprising the steps of:
  reading/writing the data stored in a volatile state at an address in said memory means in accordance with an access command indicating the address;
  transferring the data stored in said memory means from the volatile state into a non-volatile state; and
  recalling the data stored in said memory means in the non-volatile state into the volatile state,
  wherein said recalling step is selectively performed for a section of said memory means which includes the address before said reading/writing step is performed when the data at the address is stored in the non-volatile state.

17. A method for driving a semiconductor memory device including memory means for storing data having volatile and non-volatile capability, comprising the steps of:
  reading/writing the data stored in a volatile state at the address in said memory means in accordance with an access command indicating the address;
  transferring the data stored in said memory means from the volatile state into a non-volatile state;
  recalling the data stored in said memory means in the non-volatile state into the volatile state;
  indicating if the recalling step has been performed, after either supplying power to said semiconductor memory device or a last transferring step has been performed; and
  controlling said reading/writing and recalling steps based on an indication by said indicating step, whereby
  in a case where said indication is positive for the address, said reading/writing step is performed for the data stored at the address, and
  in a case where said indication is negative for the address, said recalling step is performed for a section of said memory means which includes the address before said reading/writing step is performed.

18. A method for driving a semiconductor memory device according to claim 17, wherein in a case where said indication is negative for a first section of said memory means including the address and positive for a second section of said memory means other than the first section, said transferring step is preformed for the data stored in at least a part of the second section.

19. A method for driving a semiconductor memory device according to claim 18, wherein said transfer step is performed for the second section during said recall step is performed for the first section.

20. A method for driving a semiconductor memory device according to claim 18, wherein said transfer step is performed for the second section before or after said recall operation is performed for the first section.

21. A method for driving a semiconductor memory device according to claim 18, wherein said transferring step is performed when a total amount of addresses included in the second section is larger than a predetermined value.

22. A method for driving a semiconductor memory device according to claim 17, further comprising the step of generating a wait signal, the wait signal being output at least during said recall means performs the recall operation.

23. A method for driving a semiconductor memory device according to claim 17, further comprising the step of generating a store requiring signal for a section of said memory means, the store requiring signal being output in a case where said indication is positive for any address included in the section.

24. A method for driving a semiconductor memory device according to claim 18, further including the step of refreshing the data stored in the volatile state in the second section of said memory means, during said recalling step is performed for the first section.

25. A method for driving a semiconductor memory device according to claim 20, further comprising the steps of:
  counting a number of successive refresh operations performed for an address in said refreshing step; and
  controlling said transferring step based on the number of the successive refresh operations, whereby said transferring step is performed for the address when the number is larger than a predetermined value.

26. A method for driving a semiconductor memory device according to claim 25, wherein said counting step is performed after a last read/write operation performed in said reading/writing step.

* * * * *